(12) United States Patent
Tsai et al.

(10) Patent No.: US 11,990,430 B2
(45) Date of Patent: May 21, 2024

(54) BONDING STRUCTURES OF INTEGRATED CIRCUIT DEVICES AND METHOD FORMING THE SAME

(71) Applicant: Taiwan Semiconductor Manufacturing Co., Ltd., Hsinchu (TW)

(72) Inventors: Chen-Yu Tsai, Hsinchu (TW); Ku-Feng Yang, Baoshan Township (TW); Wen-Chih Chiou, Zhunan Township (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 343 days.

(21) Appl. No.: 17/186,742

(22) Filed: Feb. 26, 2021

(65) Prior Publication Data

US 2022/0238466 A1 Jul. 28, 2022

Related U.S. Application Data

(60) Provisional application No. 63/142,534, filed on Jan. 28, 2021.

(51) Int. Cl.
*H01L 23/00* (2006.01)

(52) U.S. Cl.
CPC .............. *H01L 24/03* (2013.01); *H01L 24/05* (2013.01); *H01L 24/27* (2013.01); *H01L 24/29* (2013.01); *H01L 24/08* (2013.01); *H01L 24/32* (2013.01); *H01L 2224/03013* (2013.01); *H01L 2224/0345* (2013.01); *H01L 2224/03462* (2013.01); *H01L 2224/03464* (2013.01); *H01L 2224/0355* (2013.01); *H01L 2224/03612* (2013.01); *H01L 2224/03622* (2013.01); (Continued)

(58) Field of Classification Search
None
See application file for complete search history.

(56) References Cited

U.S. PATENT DOCUMENTS

| 8,124,522 B1 * | 2/2012 | Wu | H01L 21/76825 438/797 |
| 2003/0224595 A1 * | 12/2003 | Smith | H01L 21/76814 257/E21.252 |

(Continued)

FOREIGN PATENT DOCUMENTS

| JP | H08316234 A | 11/1996 |
| KR | 20020008615 A | 1/2002 |

(Continued)

*Primary Examiner* — Nishath Yasmeen
(74) *Attorney, Agent, or Firm* — Slater Matsil, LLP

(57) ABSTRACT

A method includes forming a conductive pad over an interconnect structure of a wafer, forming a capping layer over the conductive pad, forming a dielectric layer covering the capping layer, and etching the dielectric layer to form an opening in the dielectric layer. The capping layer is exposed to the opening. A wet-cleaning process is then performed on the wafer. During the wet-cleaning process, a top surface of the capping layer is exposed to a chemical solution used for performing the wet-cleaning process. The method further includes depositing a conductive diffusion barrier extending into the opening, and depositing a conductive material over the conductive diffusion barrier.

19 Claims, 33 Drawing Sheets

(52) U.S. Cl.
CPC ......... *H01L 2224/0381* (2013.01); *H01L 2224/05083* (2013.01); *H01L 2224/05084* (2013.01); *H01L 2224/05546* (2013.01); *H01L 2224/05564* (2013.01); *H01L 2224/08145* (2013.01); *H01L 2224/08225* (2013.01); *H01L 2224/2781* (2013.01); *H01L 2224/27831* (2013.01); *H01L 2224/29006* (2013.01); *H01L 2224/29027* (2013.01); *H01L 2224/29028* (2013.01); *H01L 2224/32145* (2013.01); *H01L 2224/32225* (2013.01)

(56) References Cited

U.S. PATENT DOCUMENTS

| | | | | |
|---|---|---|---|---|
| 2007/0066072 | A1* | 3/2007 | Suh | H01L 21/76808 438/704 |
| 2008/0050933 | A1* | 2/2008 | Ozaki | H01L 21/02203 257/E21.24 |
| 2009/0061634 | A1* | 3/2009 | Feurprier | H01L 21/76814 438/700 |
| 2009/0181542 | A1* | 7/2009 | Lo | H01L 21/02063 438/700 |
| 2010/0227470 | A1* | 9/2010 | Nagano | H01L 21/76814 257/E21.585 |
| 2011/0034027 | A1* | 2/2011 | Kuo | H01L 21/76898 257/E21.597 |
| 2011/0209899 | A1* | 9/2011 | Hill | H05K 3/4007 29/829 |
| 2013/0026606 | A1 | 1/2013 | Farooq et al. | |
| 2014/0110862 | A1 | 4/2014 | Jeng et al. | |
| 2016/0056090 | A1 | 2/2016 | Yang et al. | |
| 2019/0259650 | A1* | 8/2019 | Han | H01L 21/76865 |
| 2020/0058593 | A1* | 2/2020 | Kelly | H01L 23/53209 |
| 2020/0144107 | A1* | 5/2020 | Dutta | H01L 21/76816 |

FOREIGN PATENT DOCUMENTS

| | | |
|---|---|---|
| KR | 20030001074 A | 1/2003 |
| KR | 20110075922 A | 7/2011 |
| KR | 20150098699 A | 8/2015 |

* cited by examiner

BONDING STRUCTURES OF INTEGRATED CIRCUIT DEVICES AND METHOD FORMING THE SAME

PRIORITY CLAIM AND CROSS-REFERENCE

This application claims the benefit of the U.S. Provisional Application No. 63/142,534, filed on Jan. 28, 2021, and entitled "Semiconductor Structure and Method of Forming the Same," which application is hereby incorporated herein by reference.

BACKGROUND

In the formation of three-dimensional (3D) packages, package components such as device dies, packages, interposers, package substrates, or the like, are bonded to each other. The bonding may be performed through direct metal-to-metal bonding, hybrid bonding, or the like. Bonding structures are formed in the package components, and are used to bond the package components together.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 12A-12E, 12F-1, and 12F-2 illustrate the cross-sectional views of intermediate stages in the formation of some bonding structures in accordance with some embodiments.

FIG. 13D-1 illustrates an amplified view of a portion of the bonding structure in FIG. 13D in accordance with some embodiments.

DETAILED DESCRIPTION

Figure 1:
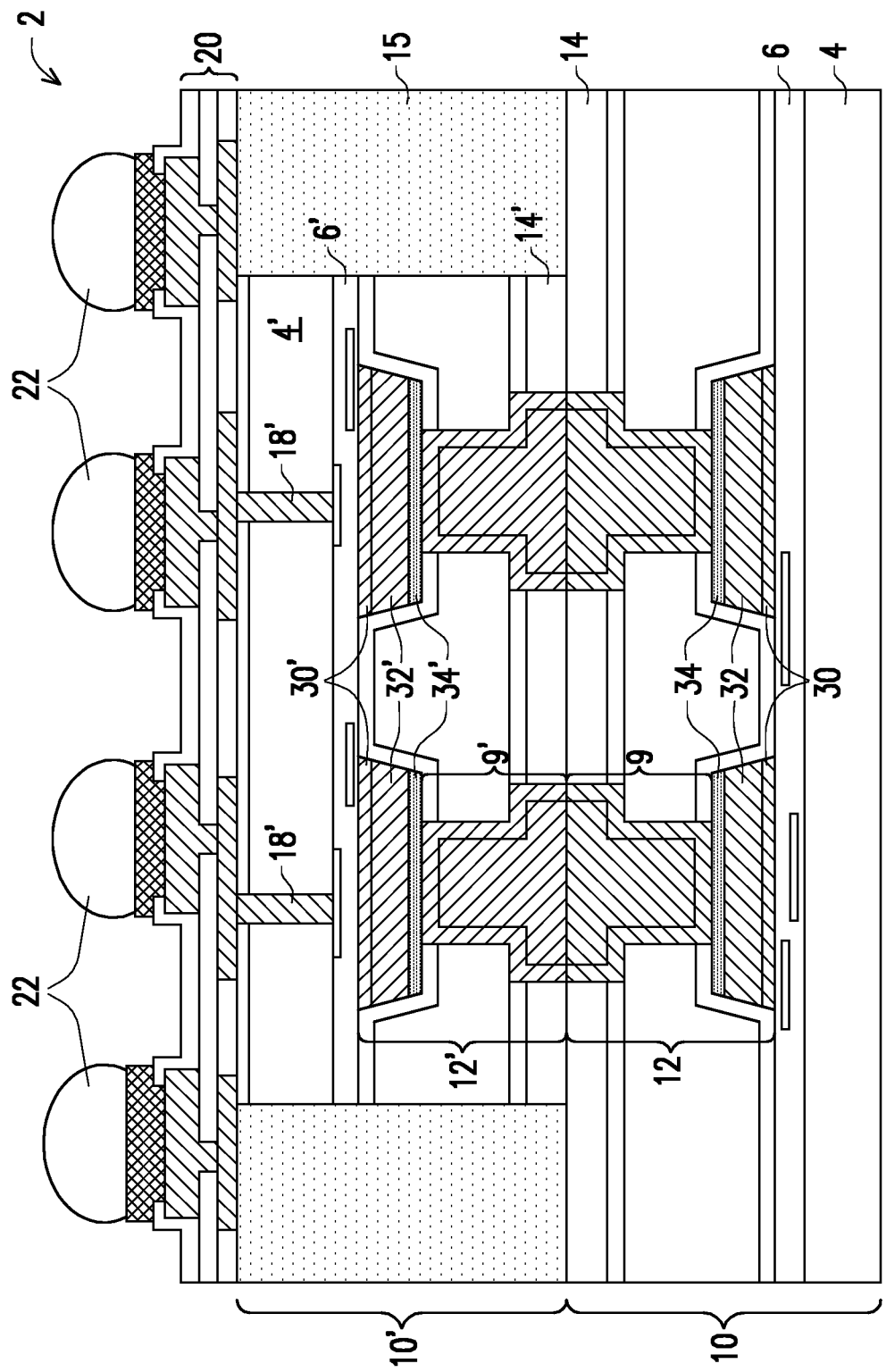
FIG. 1 illustrates a cross-sectional view of a package having bonding structures in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Bonding structures for bonding package components and the method of forming the same are provided. In accordance with some embodiments of the present disclosure, the formation of the bonding structures includes forming a capping layer over a metal pad. Dielectric layers are formed over the capping layer, and an opening is formed in the dielectric layers to reveal the capping layer. A wet pre-cleaning process may be performed to clean the opening. After the wet pre-cleaning process, a sputtering process may optionally be performed to remove the exposed portion of the capping layer. A conductive feature may then be formed to extend into the dielectric layers and contacting the capping layer. Since the metal pad is not exposed to the chemical used for the wet pre-cleaning process, galvanic corrosion of the metal pad is avoided. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIG. 1 illustrates a package 2, which includes package components 10 and 10' bonded to each other. Each of package components 10 and 10' may be a device die, a package, a silicon interposer (with silicon as a substrate), an organic interposer, a package substrate, a printed circuit board, or the like. In accordance with some embodiments, package component 10 includes substrate 4, which may be a semiconductor substrate such as a silicon substrate. Interconnect structure 6, which may include dielectric layers and metal lines and vias (not shown) in the dielectric layers, is formed over substrate 4. Metal pad 32 is formed over interconnect 6, and may be electrically coupled to the devices (such as transistors, resistors, capacitors, etc.) in package component 10. Capping layer 34, which may be formed of a dense conductive layer or a dense dielectric layer, is formed over metal pad 32. Diffusion barrier 30 may be formed underlying metal pad 32. Electrical connector 9, which may include a metal pillar or a metal via, is formed on and electrically (and/or signally) connected to metal pad 32. Electrical connector 9 may contact the top surface of (hence is stopped on) capping layer 34, or may penetrate through capping layer 34, with the sidewalls of electrical connector 9 contacting the sidewalls of capping layer 34.

In accordance with some embodiments, package component 10' includes substrate 4', which may be a semiconductor substrate such as a silicon substrate. Through-vias 18 (also referred to as through-substrate vias or through-silicon vias), are formed penetrating through substrate 4', Interconnect structure 6', which may include dielectric layers and metal lines and vias (not shown) in the dielectric layers, is formed on substrate 4'. Metal pad 32' is formed on interconnect structure 6', and may be electrically coupled to the devices (such as transistors, resistors, capacitors, etc.) in package component 10'. Capping layer 34' is formed over metal pad 32'. Electrical connector 9' is formed on and electrically (signally) connected to metal pad 32'. Electrical connector 9' may land on or penetrate through capping layer 34'. Diffusion barrier 3o' is also formed. In accordance with some embodiments, package component 10 is bonded to package component 10' through hybrid bonding, with electrical connector 9 bonding to electrical connector 9' through direct metal-to-metal bonding (through inter-diffusion), and surface dielectric layer 14 bonding to dielectric layer 14' through fusion bonding. In accordance with alternative embodiments, electric connectors 9 and 9' protrude out of the corresponding dielectric layers 14 and 14', and direct metal-to-metal bonding is adopted, with an underfill (not shown) filling the gap between package components 10 and 10'. In accordance with yet alternative embodiments, a solder region (not shown) may be between and bonding electrical connectors 9 and 9' together.

Package component 10' may be encapsulated in encapsulant 15, which may include a molding compound, a molding underfill, an epoxy, a resin, and/or the like. Fan-out interconnector structure 20 is formed over and electrically coupled to package components 10 and 10'. Electrical connectors such as solder regions 22 are formed at the top surface of package 2.

FIGS. 2A through 2H illustrate the cross-sectional views of intermediate stages in the formation of a bonding structure in a package component in accordance with some embodiments of the present disclosure. The corresponding processes are also reflected schematically in the process flow shown in FIG. 15. The corresponding formed package component may be package components 10 (or package component 10') in FIG. 1.

Figure 2A:
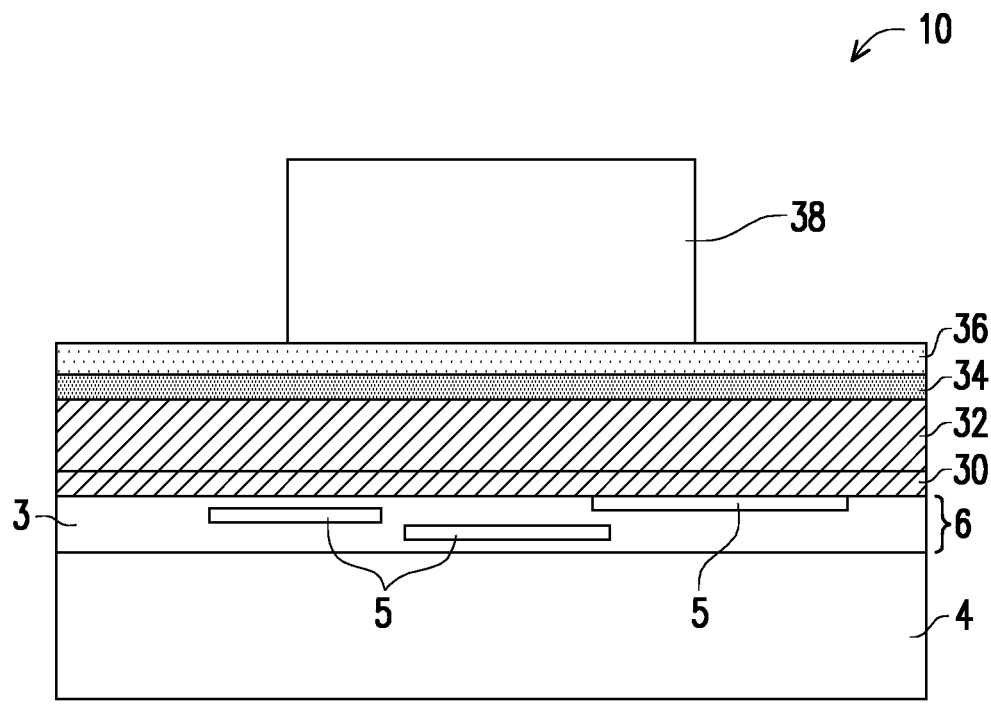
FIGS. 2A-2H illustrate the cross-sectional views of intermediate stages in the formation of a bonding structure in accordance with some embodiments.

Referring to FIG. 2A, an initial structure of package component 10 is provided, which includes substrate 4 (which may be a semiconductor substrate) and interconnect structure 6 over substrate 4. In accordance with some embodiments in which package component 10 is a device die, there may be integrated circuit devices (not shown) such as transistors at the top surface of semiconductor substrate 4. In accordance with alternative embodiments, for example, when package component 10 is an interposer, a package substrate, or the like, no active devices and/or passive device are formed. Interconnect structure 6 may include dielectric layers 3 and metal lines and vias 5, which are illustrated schematically without showing the details. In accordance with some example embodiments, dielectric layers 3 may include low-k dielectric layers, and each of metal lines/vias 5 may include copper and a diffusion barrier under copper, and may be formed using damascene processes.

Figure 15:
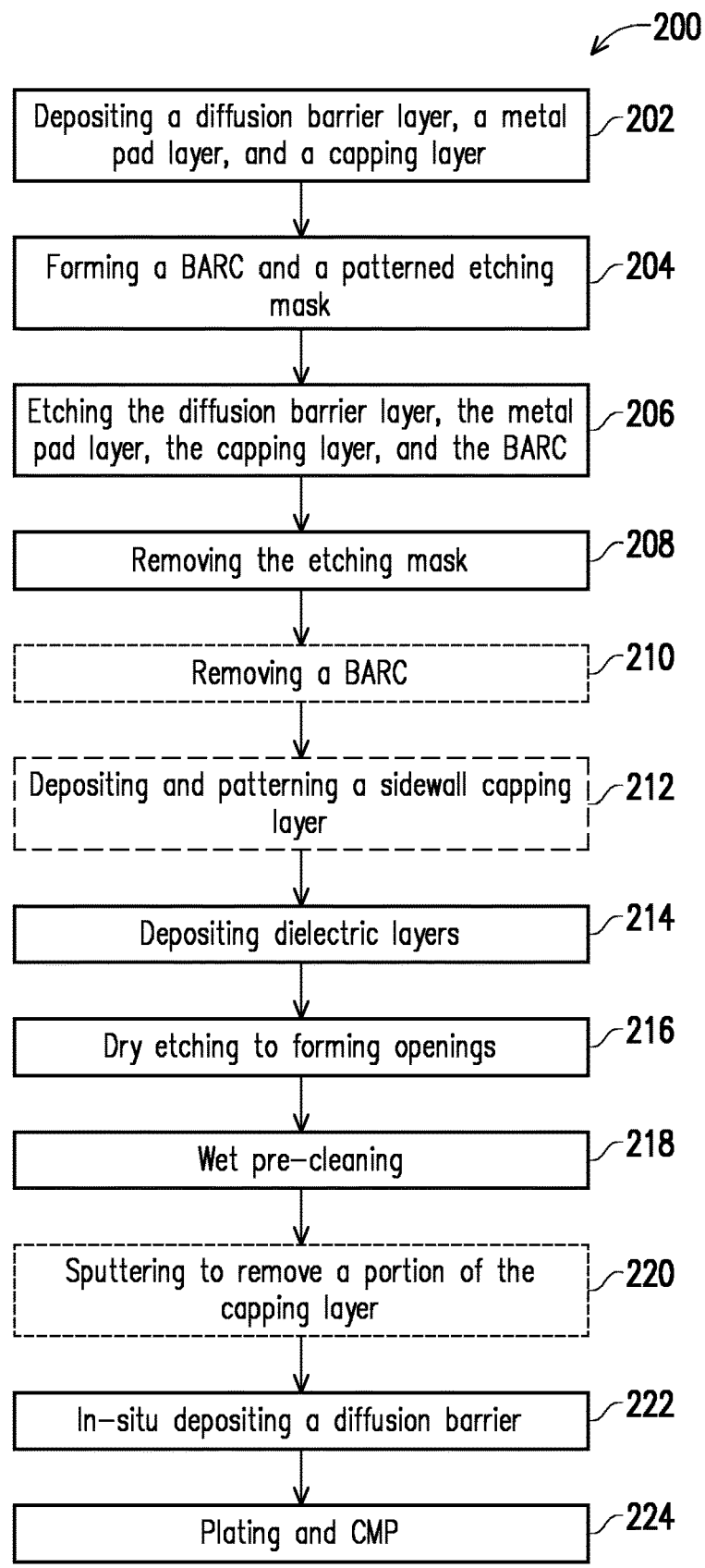
FIG. 15 illustrates a process flow for forming a bonding structure for a package component in accordance with some embodiment

Referring further to FIG. 2A, (blanket) diffusion barrier layer 30, (blanket) metal pad layer 32, and (blanket) capping layer 34 are deposited. The respective process is illustrated as process 202 in the process flow 200 as shown in FIG. 15. In accordance with some embodiments, blanket diffusion barrier layer 30 is formed of or comprises a material selected from titanium, titanium nitride, tantalum, tantalum nitride, or the like, or multi-layers thereof. Metal pad layer 32 is deposited over diffusion barrier layer 30, and may include copper, aluminum, nickel, tungsten, or the like. In accordance with some embodiments, metal pad layer 32 comprises AlCu. The deposition method may include Physical Vapor Deposition (PVD), Chemical Vapor Deposition (CVD), or the like.

Capping layer 34 is deposited over metal pad layer 32. In accordance with some embodiments, capping layer 34 is formed of or comprises a conductive material, which may include titanium, titanium nitride, tantalum, tantalum nitride, or the like, or multi-layers thereof. In accordance with alternative embodiments, capping layer 34 is formed of a dielectric material, which may include aluminum oxide (such as $Al_2O_3$), aluminum nitride, silicon nitride, or the like, combinations thereof, or multi-layers thereof. When formed of a dielectric material, capping layer 34 may be thin, for example, with a thickness smaller than about 100 Å, and the thickness may be in the range between about 30 Å and about 100 Å. The formation of capping layer 34 may include Atomic Layer Deposition (ALD), CVD, Plasma Enhanced CVD (PECVD), or the like.

Bottom Anti-Reflective Coating (BARC) 36 is formed over capping layer 34, and patterned etching mask 38 is formed over BARC 36. The respective process is illustrated as process 204 in the process flow 200 as shown in FIG. 15. In accordance with some embodiments, the patterned etching mask 38 includes a photo resist, which is patterned through a light-exposure process and a development process. Etching mask 38 may also be a single-layer mask or may include a plurality of layers such as a tri-layer. In accordance with some embodiments, BARC 36 may be formed of or comprise SiON, SiOC, SiOCN, or the like, or multi-layers thereof. In accordance with alternative embodiments, BARC 36 may be formed of an organic material such as a cross-linked photo resist. BARC 36 is used to reduce the reflection during the light-exposure process for patterning the overlying etching mask 38.

Figure 2B:
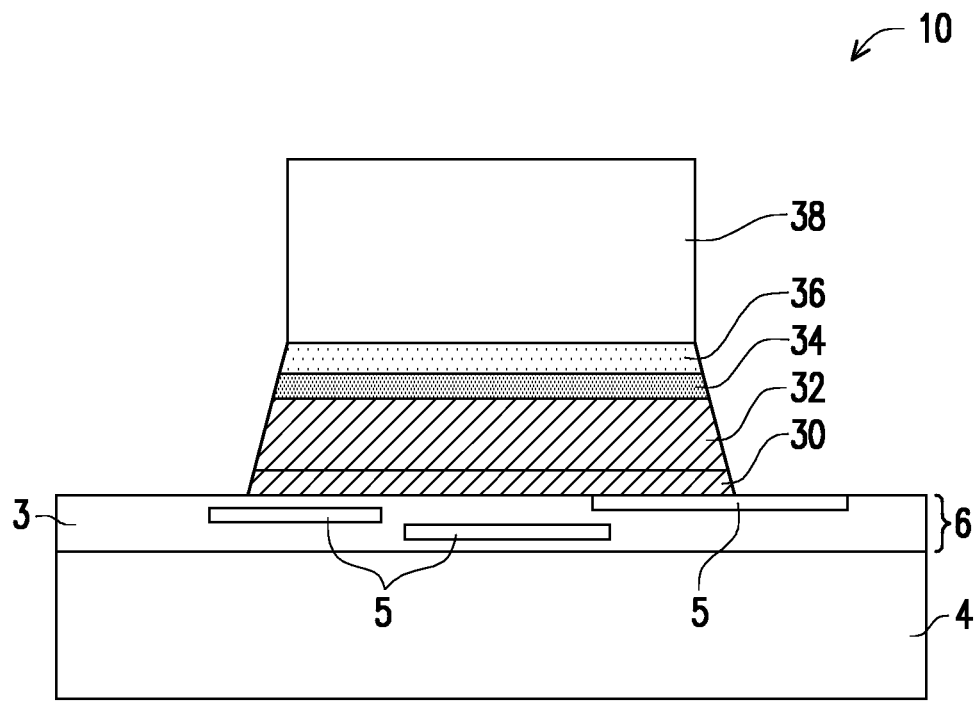
Figure 2C:
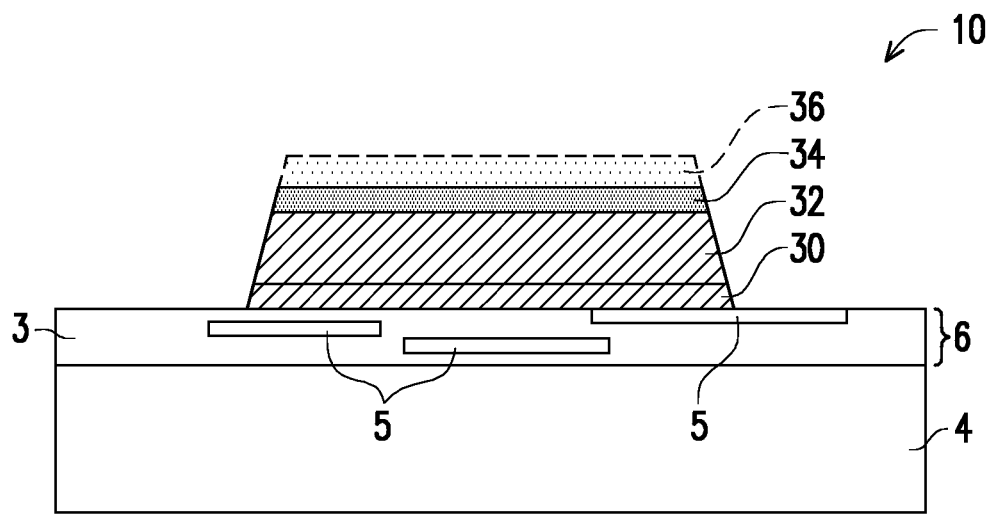

In a subsequent process, the patterned etching mask 38 is used to etch the underlying BARC 36, capping layer 34, metal pad layer 32, and diffusion barrier layer 30. The patterned metal pad layer 32 and diffusion barrier layer 30 are referred to as metal pad 32 and diffusion barrier layer 30, respectively. The resulting structure is shown in FIG. 2B. The respective process is illustrated as process 206 in the process flow 200 as shown in FIG. 15. The resulting diffusion barrier 30 and metal pad 32 are electrically connected to the underlying metal lines and vias. Next, etching mask 38 is removed, and the resulting structure is shown in FIG. 2C. The respective process is illustrated as process 208 in the process flow 200 as shown in FIG. 15. In accordance with some embodiments, BARC 36 is removed from capping layer 34. The respective process is illustrated as process 210 in the process flow 200 as shown in FIG. 15. In accordance with alternative embodiments, BARC 36 is left unremoved from capping layer 34, and is left in the final structure as an additional capping layer. Accordingly, BARC 36 (which is also referred to as dielectric capping layer 36 in accordance with these embodiments) is shown as being dashed to indicate that it may or may not exist in the following structures. The respective process 210 as shown in FIG. 15 is also shown as dashed. Throughout the description, when a feature or a process is shown as being dashed, it indicates the corresponding feature or process may or may not exist (or be adopted).

Figure 2D:
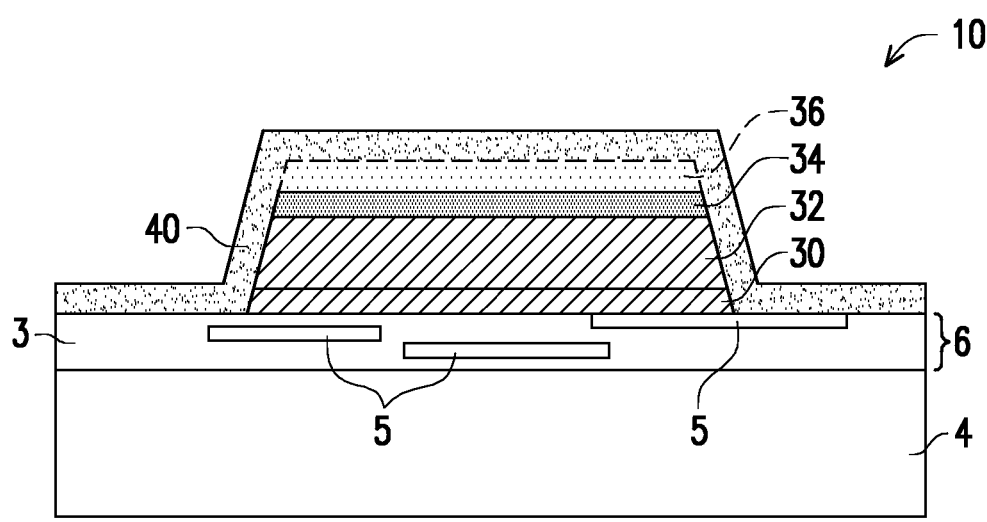

Referring to FIG. 2D, sidewall capping layer 4o is deposited. The respective process is illustrated as process 212 in the process flow 200 as shown in FIG. 15. In accordance with alternative embodiments, sidewall capping layer 40 is not formed. In accordance with some embodiments, sidewall capping layer 40 is formed of a material selected from the same group of candidate materials for forming capping layer 34. Accordingly, sidewall capping layer 40 may be a conductive layer or a dielectric layer. For example, titanium, titanium nitride, tantalum, tantalum nitride, aluminum oxide, aluminum nitride, silicon nitride, etc., may be used. The material of capping layer 34 and sidewall capping layer 40 may be the same or different from each other, and each may be any material selected from the aforementioned candidate materials. The deposition of sidewall capping layer 40 may include a conformal deposition process such as ALD, CVD, or the like.

Figure 2E:
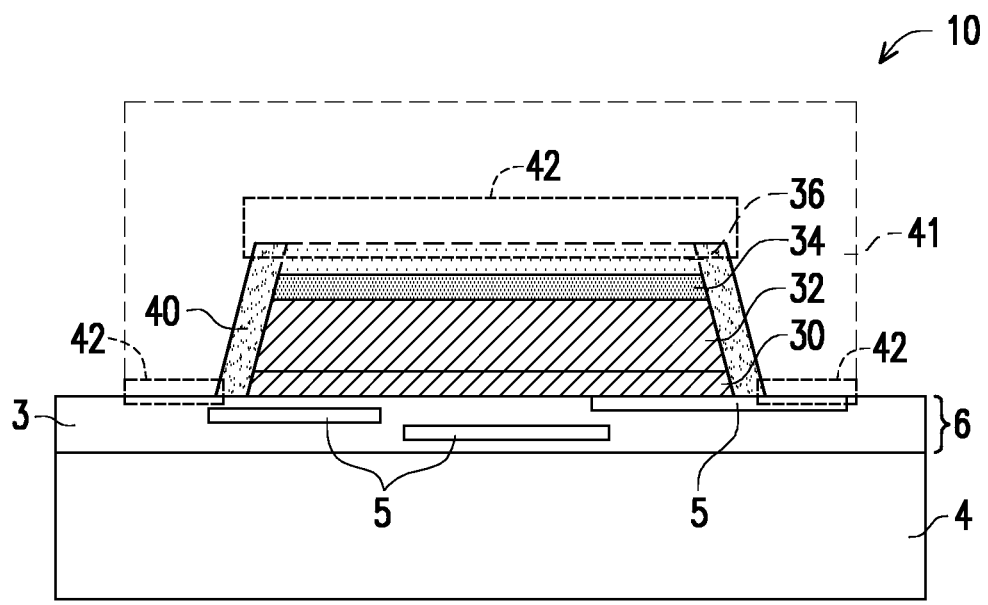

Sidewall capping layer 40 is then patterned, as shown in FIG. 2E. The respective process is also illustrated as process 212 in the process flow 200 as shown in FIG. 15. In accordance with some embodiments, the patterning of sidewall capping layer 40 is through an anisotropic etching process, which is performed without an etching mask. Accordingly, the vertical portions of sidewall capping layer 40 is left, while the horizontal portions of sidewall capping layer 40 are removed. In accordance with alternative embodiments, the patterning of sidewall capping layer 40 is performed using a patterned etching mask 41. Accordingly, some of the horizontal portions such as the portions shown in regions 42 (FIG. 2F) may be left unremoved, and left in the final structure. The subsequently formed etch stop layer 44 will be over and contact both of the vertical portions and the horizontal portions (if left unremoved) of sidewall capping layer 40.

In accordance with alternative embodiments, the processes shown in FIGS. 2D and 2E are skipped, and sidewall capping layer 40 is not formed. As a result, the subsequently formed etch stop layer 44 is in physical contact with the sidewalls of diffusion barrier 30, metal pad 32, and capping layer 34. The respective process 212 in the process flow 200 in FIG. 15 is also illustrated as being dashed to indicate this process may or may not be performed.

Figure 2F:
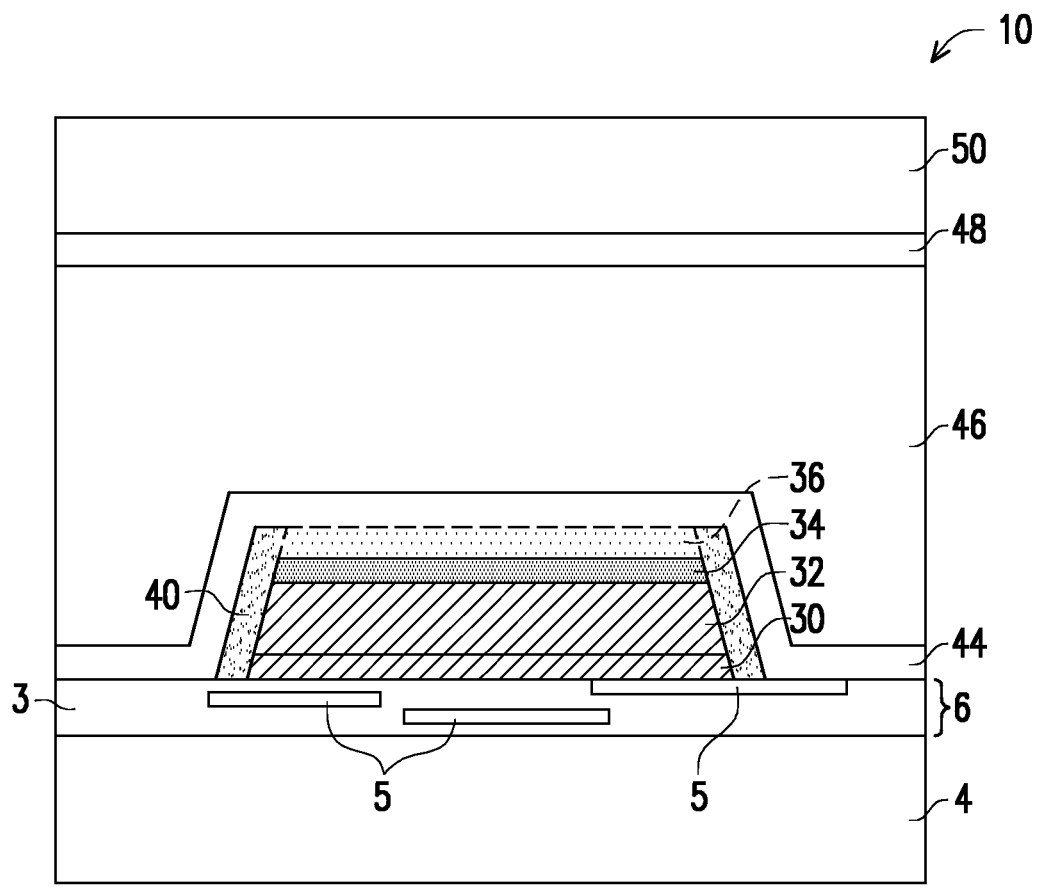

FIG. 2F illustrates the formation of etch stop layer 44, dielectric layer 46, etch stop layer 48, and dielectric layer 50. The respective process is illustrated as process 214 in the process flow 200 as shown in FIG. 15. In accordance with some embodiments, after the deposition of dielectric layer 46, a planarization process such as a Chemical Mechanical Polish (CMP) process or a mechanical grinding process is performed. Accordingly, dielectric layer 46 is sometimes referred to as a planarization layer. In accordance with some embodiments, dielectric layers 46 and 50 are formed of silicon oxide, while other materials such as undoped silicate glass, silicon nitride, silicon oxy-nitride, silicon oxycarbide, silicon oxy-carbo-nitride, or the like, may be used. Etch stop layers 44 and 48 may be formed of silicon nitride, while other materials such as aluminum oxide, aluminum nitride, silicon oxy-nitride, silicon-oxycarbide, silicon oxy-carbo-nitride, or the like, may be used.

In accordance with alternative embodiments in which sidewall capping layer 40 is not formed, or the top horizontal portion of sidewall capping layer 40 is removed, etch stop layer 44 may be in physical contact with the top surface of BARC 36, or in physical contact with the top surface of capping layer 34 if BARC 36 has been removed.

Figure 2G:
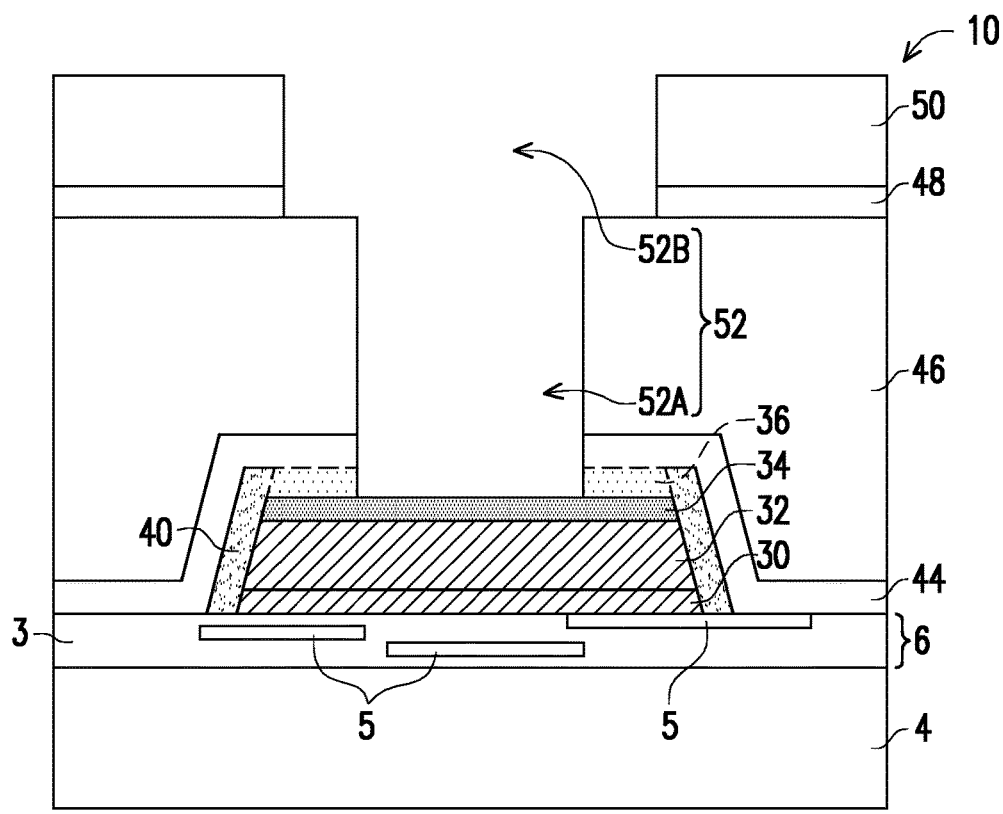

FIG. 2G illustrates the formation of openings 52, which includes the bottom opening 52A and top opening 52B. The formation process may be performed through a plurality of etching processes, with two etching masks being adopted for generating different patterns for openings 52A and 52B. The etching processes may be performed through dry etching processes, wherein the etching gases are selected according to the materials of etch stop layer 44, dielectric layer 46, etch stop layer 48, and dielectric layer 50. The respective process is illustrated as process 216 in the process flow 200 as shown in FIG. 15. In accordance with alternative embodiments, dielectric layer 50, etch stop layer 48, dielectric layer 46 are etched through dry etching, and etch stop layer 44 is etched through a wet etching process.

In accordance with some embodiments, after the formation of openings 52, a pre-cleaning process may be performed. In accordance with some embodiments, the pre-cleaning process is performed through a wet-cleaning process using a chemical solution including amine-based materials, such as XM-426 (J. T. Baker®), DuPont™ EKC265™, ACT970 (Versum Materials), or the like. The respective process is illustrated as process 218 in the process flow 200 as shown in FIG. 15.

In accordance with some embodiments, the top surface of capping layer 34 is exposed to the pre-cleaning chemical solution, and capping layer 34 is not etched. Capping layer 34 thus protects the underlying metal pad 32 from galvanic corrosion, which may result in pits (holes) to be generated in metal pad 32. The pits may damage the integrity of the subsequently formed diffusion barrier 54 (FIG. 2H) since diffusion barrier 54 may fall into the pits, and hence diffusion barrier 54 will have holes also.

Figure 2H:
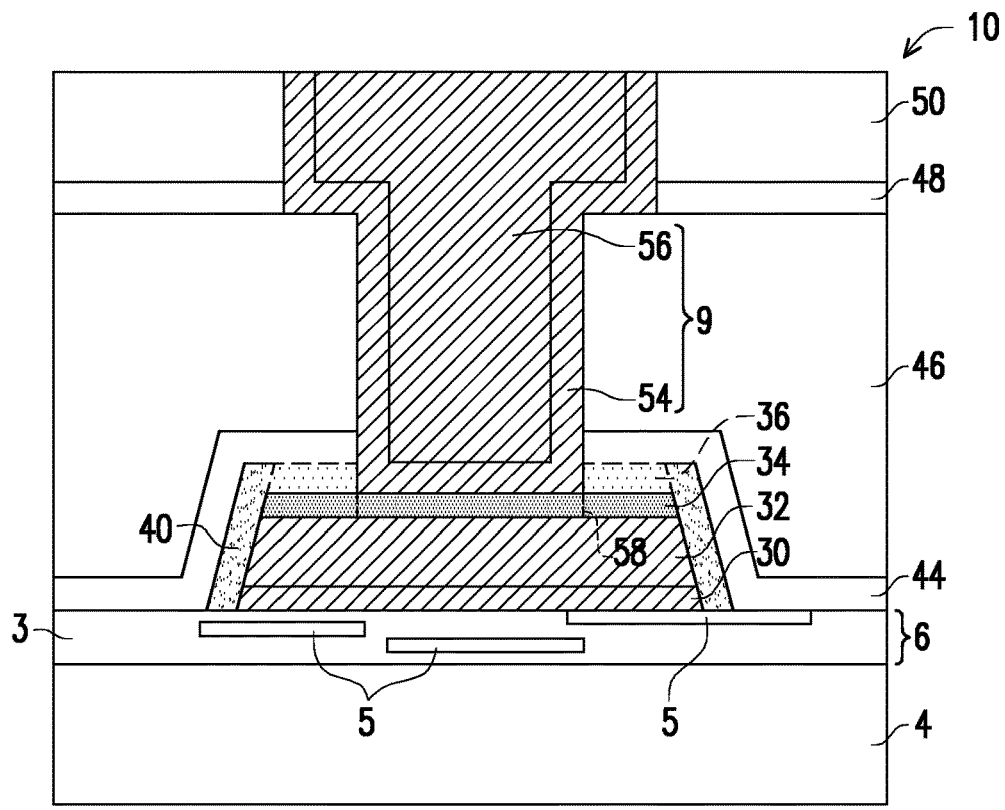

FIG. 2H illustrates the formation of electrical connector 9, which includes diffusion barrier 54 and metallic material 56. The formation process may include a damascene process. In accordance with some embodiments, diffusion barrier 54 is formed of or comprises titanium, titanium nitride, tantalum, tantalum nitride, or the like. Metallic material 56 may comprise copper or a copper alloy. In accordance with some embodiments, diffusion barrier 54 is formed using PVD, and metallic material 56 is plated in a plating process, which may include an electrochemical plating process, an electro-less plating process, or the like. After the plating of metallic material 56, a planarization process such as a CMP process or a mechanical grinding process may be performed to remove excess portions of diffusion barrier 54, resulting in the electrical connector 9.

In accordance with some embodiments, as shown in FIG. 2H, the bottom surface of electrical connector 9 is in contact with the top surface of capping layer 34. These embodiments may be implemented when capping layer 34 is formed of the conductive material (as aforementioned, such as Ti, TiN, Ta, or TaN) or a dielectric material (such as $Al_2O_3$ or AlN). In the embodiments in which capping layer 34 is formed of a dielectric material, capping layer 34 is thin so that carriers may tunnel through capping layer 34 to achieve the signal and/or electrical interconnection between electrical connector 9 and metal pad 32. For example, the thickness of capping layer 34 may be smaller than about 100 Å, and may be in the range between about 30 Å and about 100 Å.

In accordance with alternative embodiments, the portion of the capping layer 34 directly underlying opening 52A is removed before the formation of electrical connector 9, so that electrical connector 9 penetrates through capping layer 34 to be in physical contact with metal pad 32. Dashed region 58 in FIG. 2H is drawn to represent the portion of the removed portion of capping layer 34 and the portion of electrical connector 9 penetrating through capping layer 34. The respective process is illustrated as process 220 in the process flow 200 as shown in FIG. 15. In accordance with some embodiments, to prevent the galvanic corrosion of metal pad 32, capping layer 34 may be removed in a pre-clean chamber through physical ion bombardment. The process gas for removing the portion of the capping layer 34 may include Ar, Kr, Xe, or the like, and other gases such as $H_2$, $N_2$, or the like may be added. Accordingly, the removal of the portion of capping layer 34 in region 58 includes sputtering capping layer 34. The respective process 220 in the process flow 200 in FIG. 15 is also illustrated as being dashed to indicate this process may or may not be performed. After the removal of the portion of capping layer 34 in region 58, diffusion barrier 54 is deposited. The sputtering of capping layer 34 and the deposition of diffusion barrier 54 may be in-situ performed in the same production tool, (although may be in different process chambers in a same vacuum environment of the same production tool), with no vacuum break in between. For example, a PVD tool may contain a Degas chamber, a Pre-clean chamber, a barrier chamber, and a Cu Seed chamber. The process sequence may be degassing, pre-cleaning, barrier formation, and Cu seed formation. No vacuum break happens in PVD tool, i.e. wafer is in vacuum environment all the way throughout the whole process from Degassing, pre-cleaning, barrier formation, and Cu seed formation. In accordance with some embodiments, the removal of capping layer 34 may be conducted in the pre-clean chamber. Then, the wafer may be transferred to the barrier chamber to deposit diffusion barrier 54. The respective process is illustrated as process 222 in the process flow 200 as shown in FIG. 15. In accordance with these embodiments, although metal pad 32 is exposed, since metal pad 32 is not exposed to the pre-cleaning chemical (or other wet solutions), metal pad 32 doesn't suffer from galvanic corrosion. Diffusion barrier 54 may thus keep its integrity.

Next, metallic material 56 is deposited, for example, in a plating process, which may be an electrochemical plating process. A planarization process such as a CMP process or a mechanical grinding process is then performed to remove excess portions of diffusion barrier 54 and metallic material 56, and hence electrical connector 9 is formed. The respective process is illustrated as process 224 in the process flow 200 as shown in FIG. 15.

The subsequent figures illustrate cross-sectional views of intermediate stages in the formation of bonding structures in accordance with alternative embodiments of the present disclosure. Unless specified otherwise, the materials and the formation processes of the components in these embodiments are essentially the same as the like components, which are denoted by like reference numerals in the preceding embodiments shown in FIGS. 1 and 2A-2H. The details regarding the formation processes and the materials of the components shown in the subsequent figures may thus be found in the discussion of the preceding embodiments. In each of the embodiments shown in subsequent figures, capping layer 34, and possibly the overlying BARC 36, protect metal pad 32 from galvanic corrosion, similar to the preceding embodiments. If electrical connector 9 penetrates through capping layer 34, the portion of the capping layer 34 may be removed after the wet pre-cleaning process, and may be removed in-situ in the same production tool (may be in different process chambers that are in a same vacuum environment) as for depositing diffusion barrier 54.

Figure 3A:
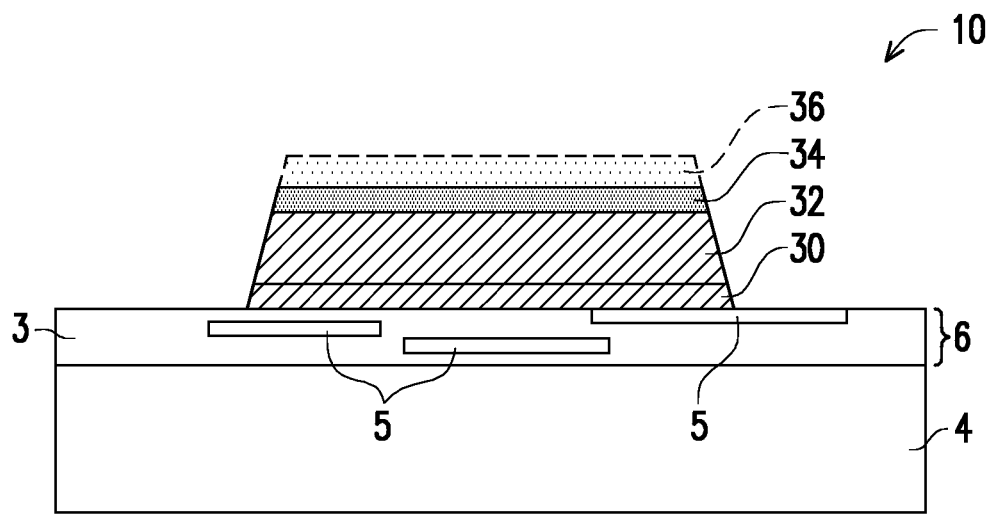
FIGS. 3A-3F illustrate the cross-sectional views of intermediate stages in the formation of a bonding structure in accordance with some embodiments.
Figure 3B:
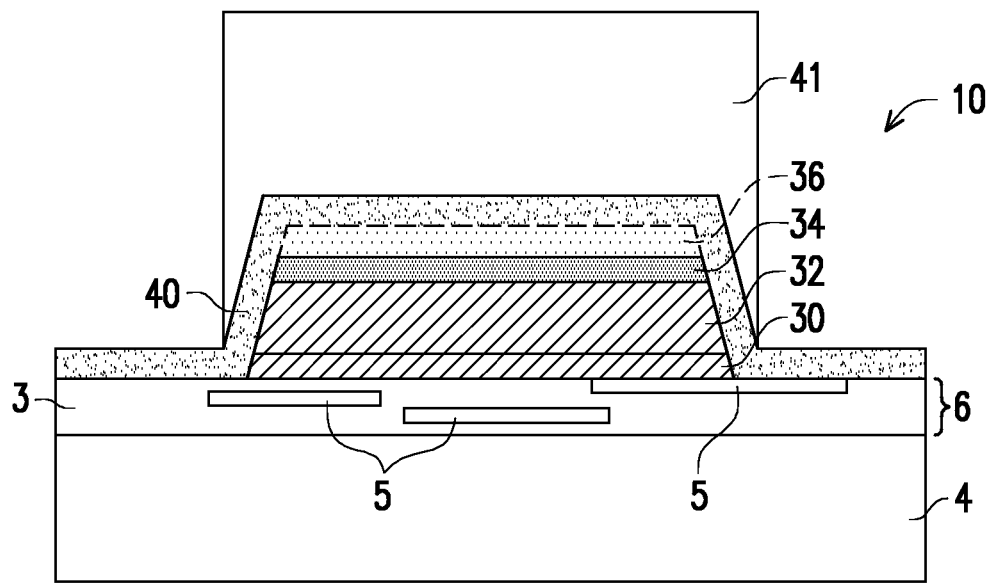
Figure 3C:
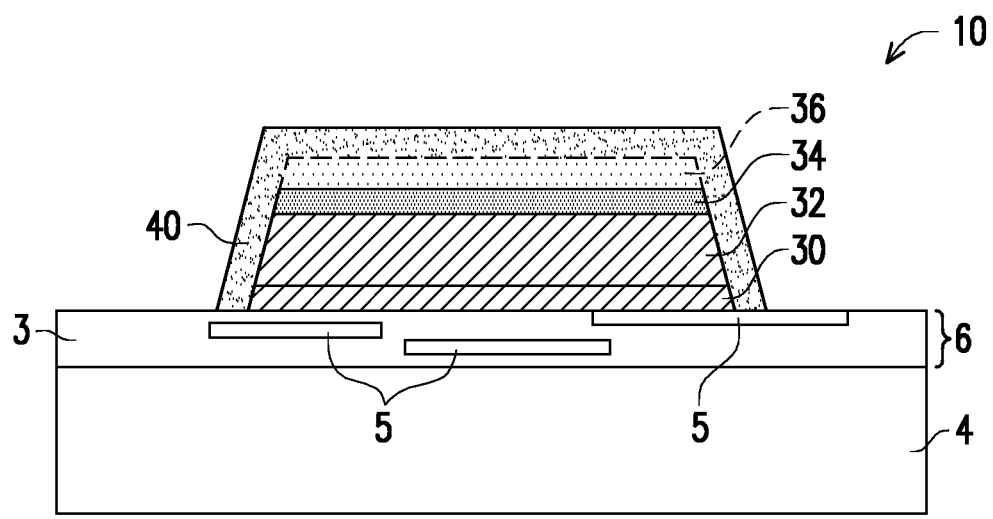
Figure 3D:
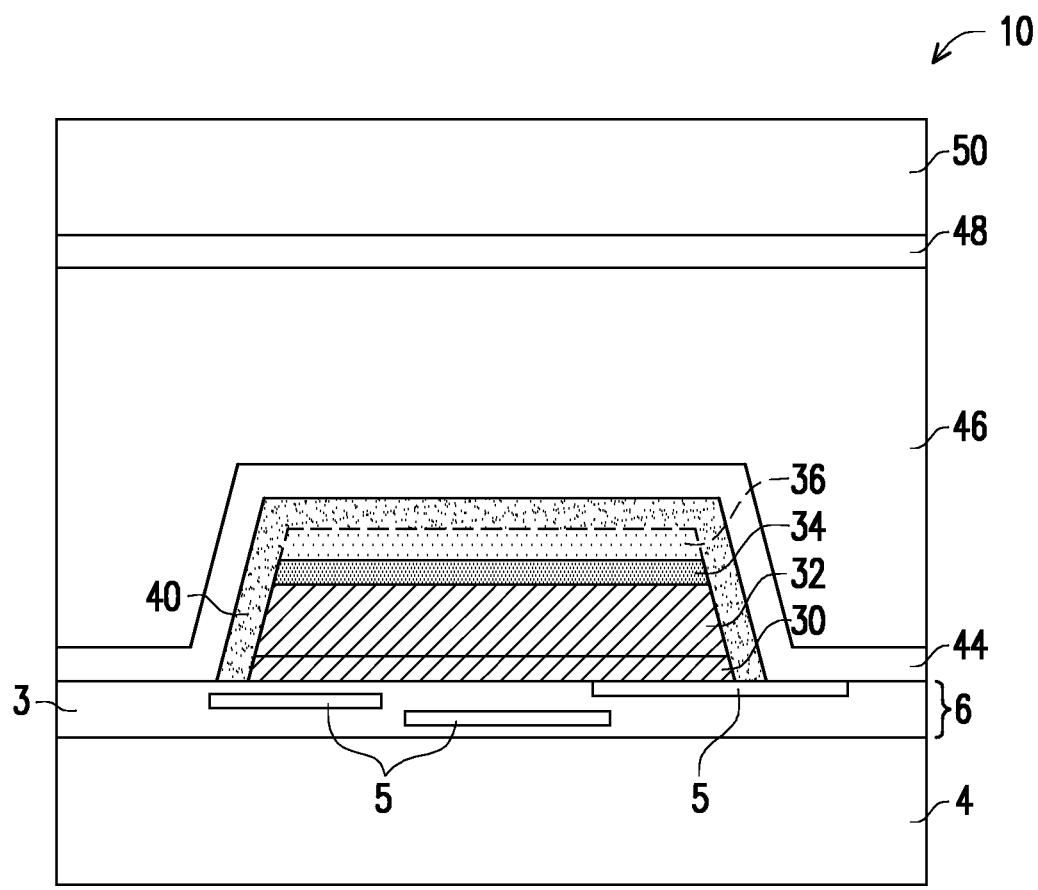
Figure 3E:
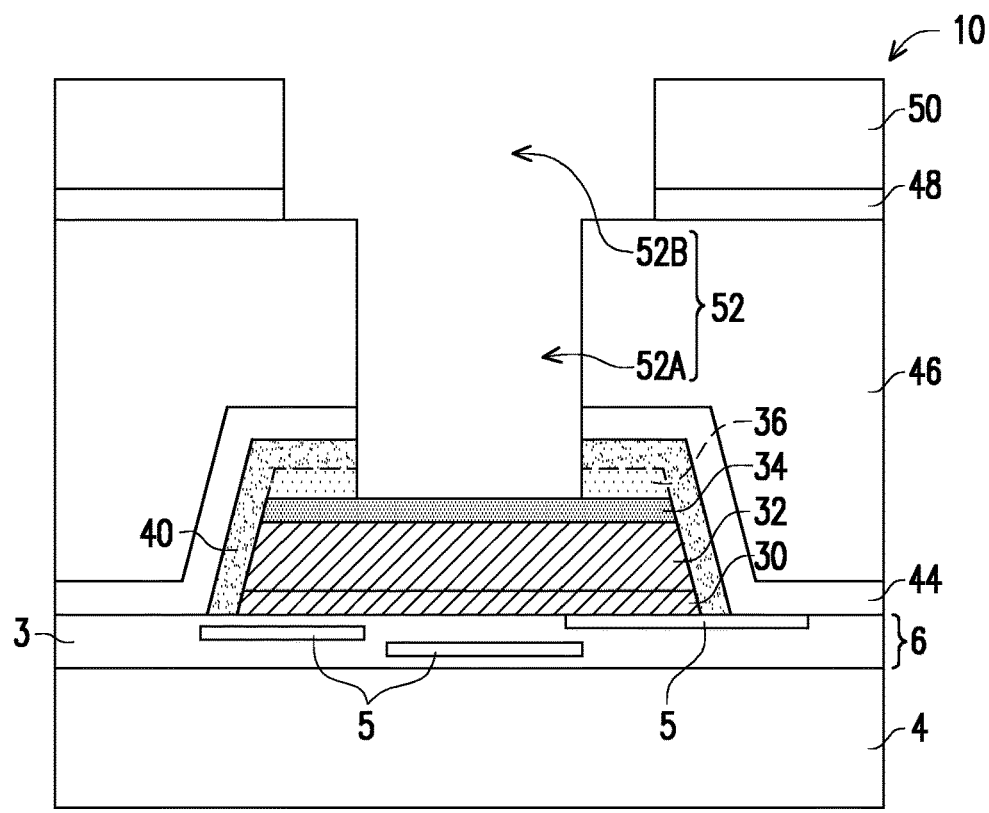

FIGS. 3A through 3F illustrate the formation of a bonding structure in accordance with some embodiments. These embodiments are similar to the embodiments as shown in FIGS. 2A through 2H, except that the patterned sidewall capping layer 40 still includes a horizontal portion overlapping metal pad 32. Referring to FIG. 3A, diffusion barrier 30, metal pad 32, capping layer 34, and the optional BARC 36 are formed over interconnect structure 6. Capping layer 34 may be a dielectric layer, while it may also be a conductive layer. The formation processes are the same as shown in FIGS. 2A-2C, and are not repeated herein. In FIG. 3B, sidewall capping layer 40 is deposited. Next, etching mask 41 is formed, which covers the portions of sidewall capping layer 40 on the top and sidewalls of metal pad 32. Sidewall capping layer 40 is then etched, followed by the removal of etching mask 41. The resulting structure is shown in FIG. 3C. Etch stop layer 44, dielectric layer 46, etch stop layer 48, and dielectric layer 50 are then deposited, as shown in FIG. 3D. Next, openings 52A and 52B are formed, as shown in FIG. 3E.

Figure 3F:
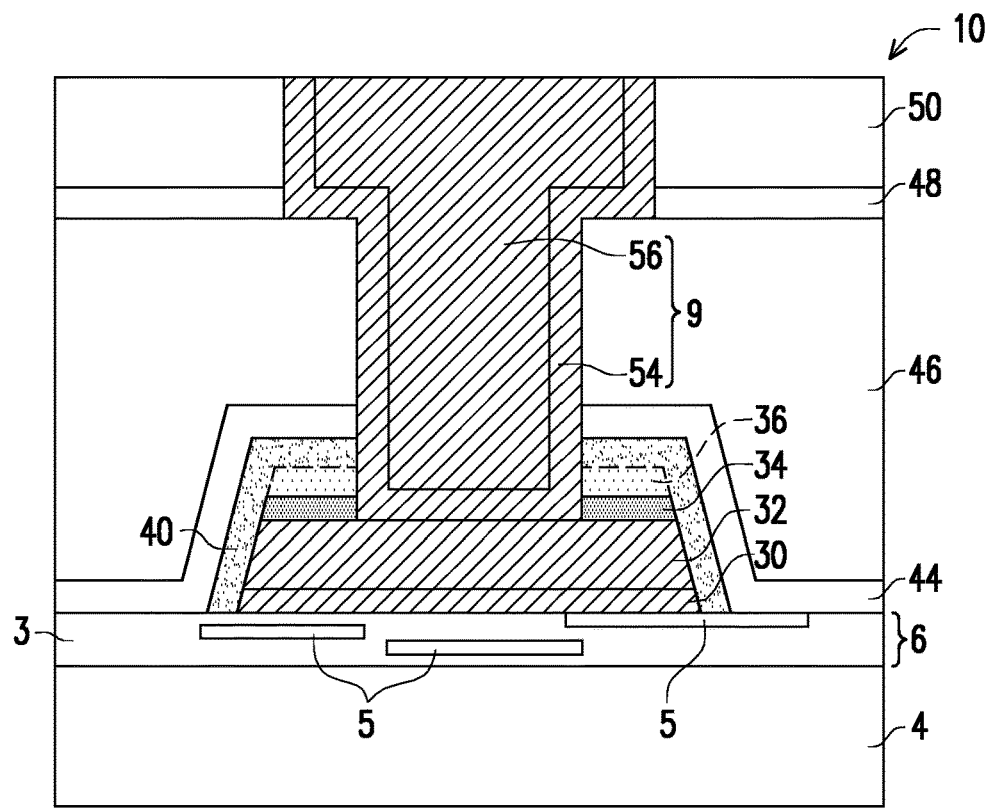

A wet pre-cleaning process may then be performed, and during the wet pre-cleaning process, capping layer 34 protects metal pad 32 from being exposed to the chemical solution used in the wet pre-cleaning process. Metal pad 32 is thus not corroded due to the galvanic corrosion. Package component 10 may then be placed into a process chamber, in which vacuum is formed. The exposed portion of capping layer 34 is then removed, for example, through sputtering. Electrical connector 9 is then formed, as shown in FIG. 3F. In accordance with some embodiments, diffusion barrier 54 is in-situ deposited in the same production tool (may be in different process chambers that are in a same vacuum environment) as the removal of capping layer 34, for example, through PVD. Metallic material 56 is then deposited, for example, through plating. A planarization process such as a CMP process or a mechanical polishing process is then performed to remove excess materials, forming the electrical structure as shown in FIG. 3F.

Figure 4A:
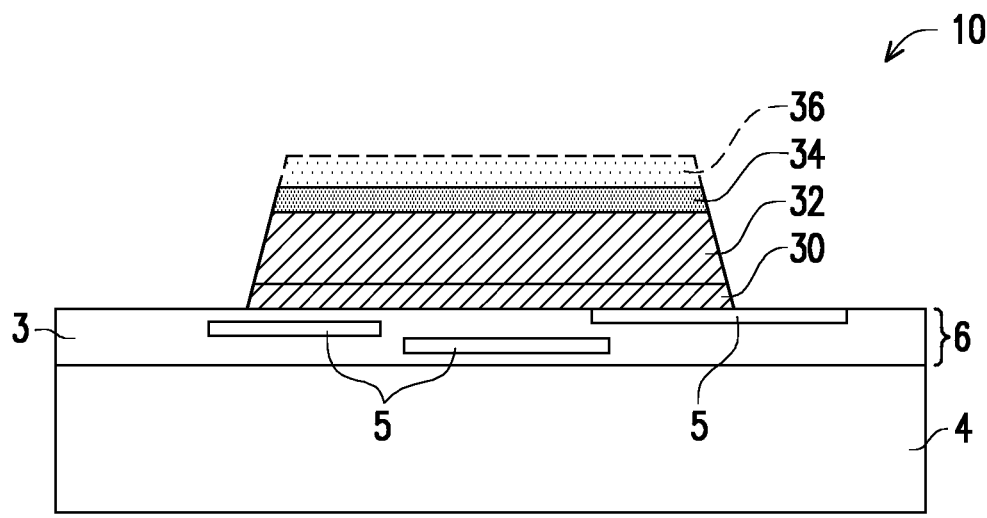
FIGS. 4A-4F illustrate the cross-sectional views of intermediate stages in the formation of a bonding structure in accordance with some embodiments.
Figure 4B:
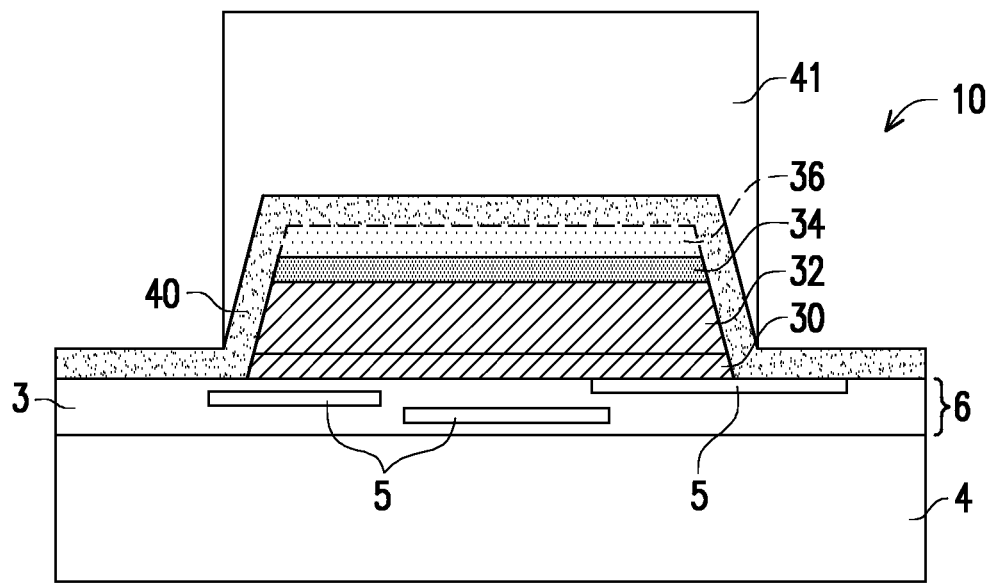
Figure 4C:
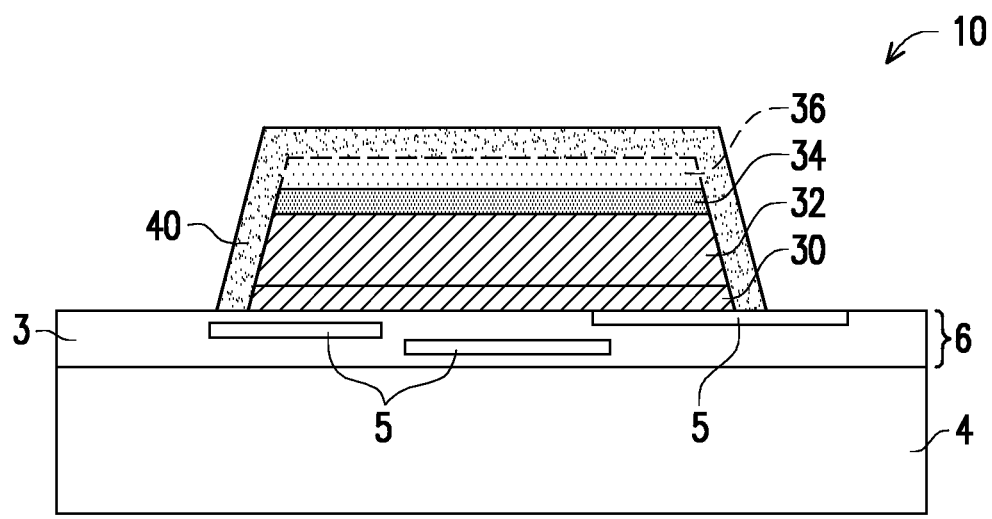
Figure 4D:
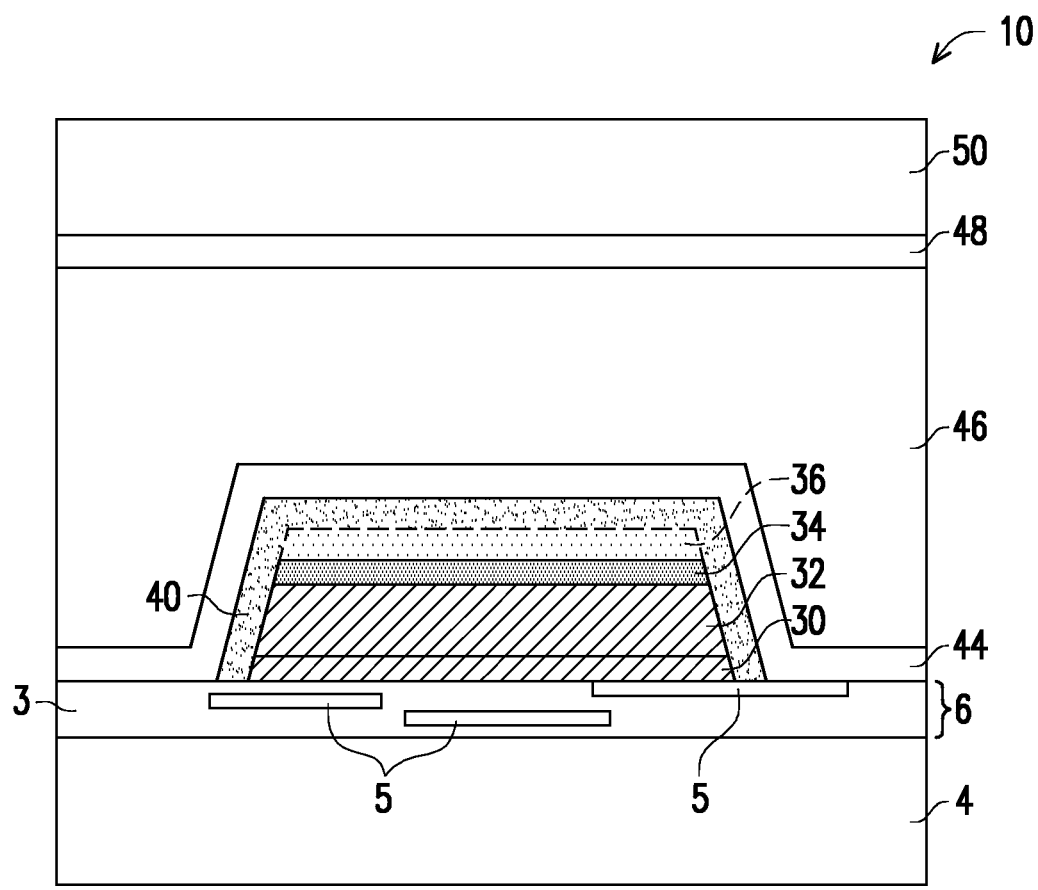
Figure 4E:
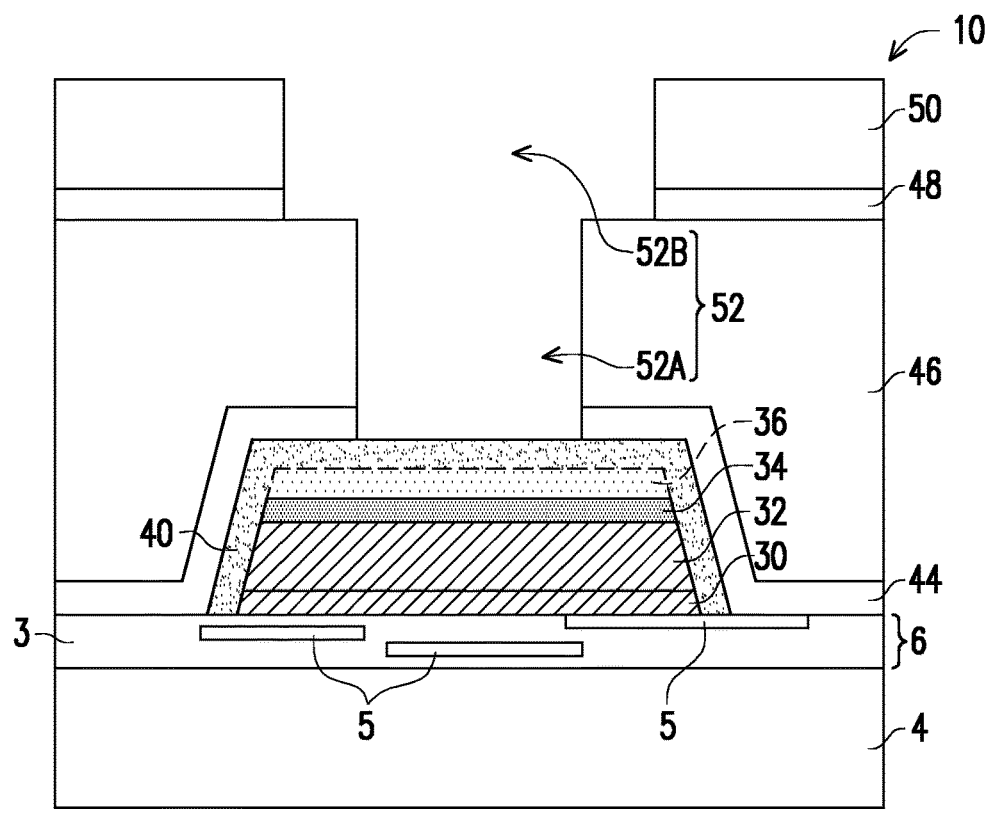
Figure 4F:
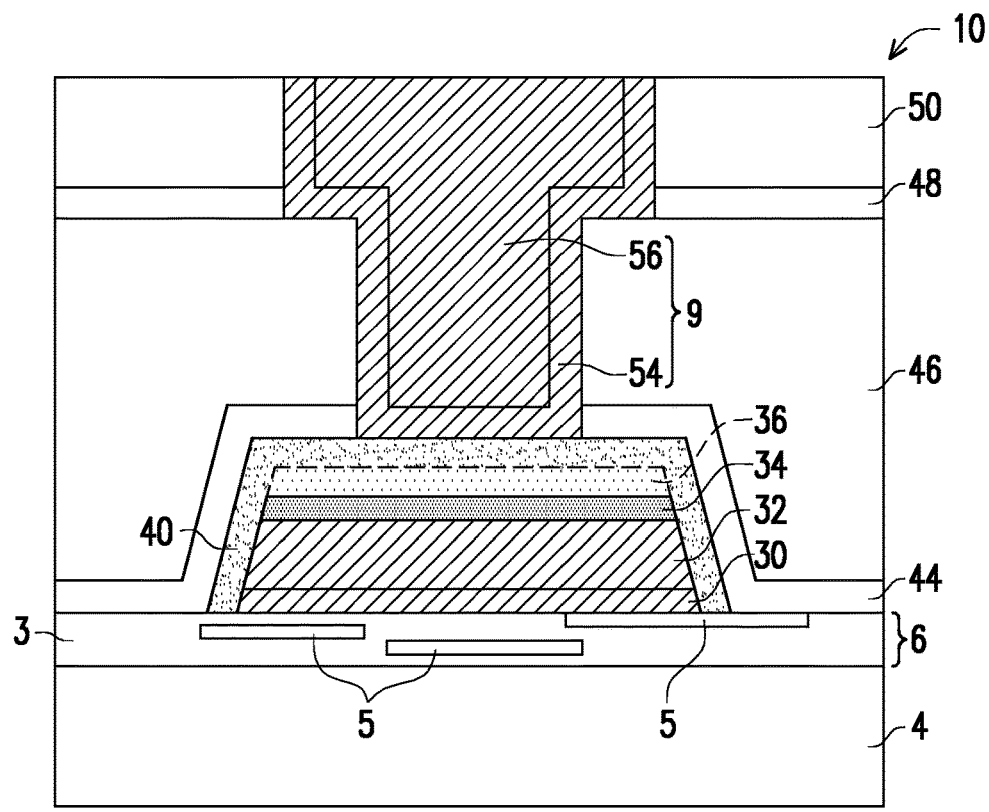

FIGS. 4A through 4F illustrate the formation of a bonding structure in accordance with some embodiments. These embodiments are similar to the embodiments as shown in FIGS. 3A through 3F, except electrical connector 9, instead of penetrating through sidewall capping layer 40 to contact metal pad 32, now lands on the top surface of sidewall capping layer 40. Referring to FIG. 4A, diffusion barrier 30, metal pad 32, capping layer 34, and BARC 36 (which may or may not be left) are formed over interconnect structure 6. Capping layer 34 may be a dielectric layer, while it may also be a conductive layer. The formation processes are the same as shown in FIGS. 2A-2C, and are not repeated herein. In FIG. 4B, sidewall capping layer 40 is deposited, which may be formed of a conductive material. Next, etching mask 41 is formed, which covers the portions of sidewall capping layer 40 on the top and the sidewalls of metal pad 32. Sidewall capping layer 40 is then etched, followed by the removal of etching mask 41. The resulting structure is shown in FIG. 4C. Etch stop layer 44, dielectric layer 46, etch stop layer 48, and dielectric layer 50 are then deposited, as shown in FIG. 4D. Next, openings 52A and 52B are formed, as shown in FIG. 4E. Opening 52A penetrates through etch stop layer 44, with the top surface of sidewall capping layer 40 being exposed. Electrical connector 9 is then formed, as shown in FIG. 4F. Electrical connector 9 has a bottom surface in contact with the top surface of the top horizontal portion of sidewall capping layer 40. In accordance with these embodiments, the total thickness of the dielectric layers in capping layer 34 (if dielectric), BARC 36 (if exists), and sidewall capping layer 40 may be smaller than about 100 Å, and may be in the range between about 30 Å and about 100 Å.

Figure 5A:
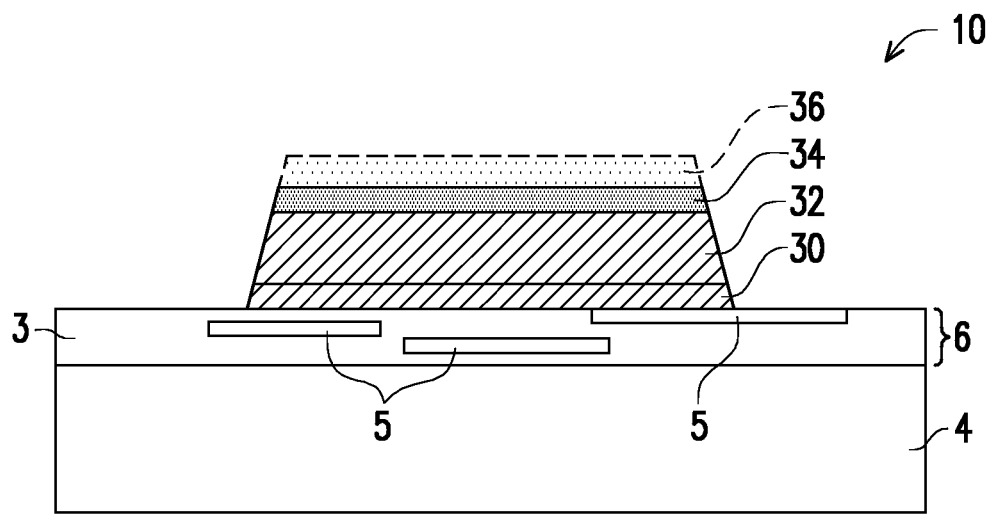
FIGS. 5A-5E illustrate the cross-sectional views of intermediate stages in the formation of a bonding structure in accordance with some embodiments.
Figure 5B:
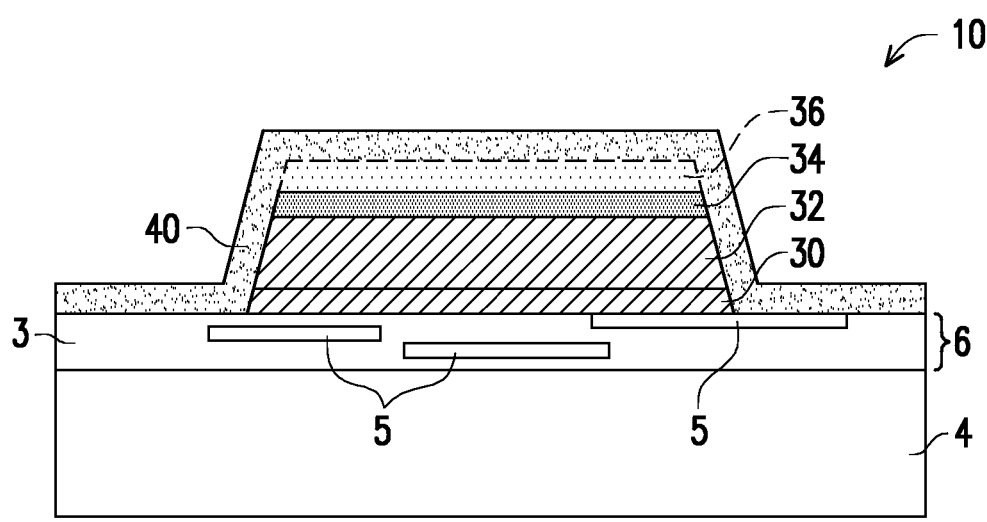
Figure 5C:
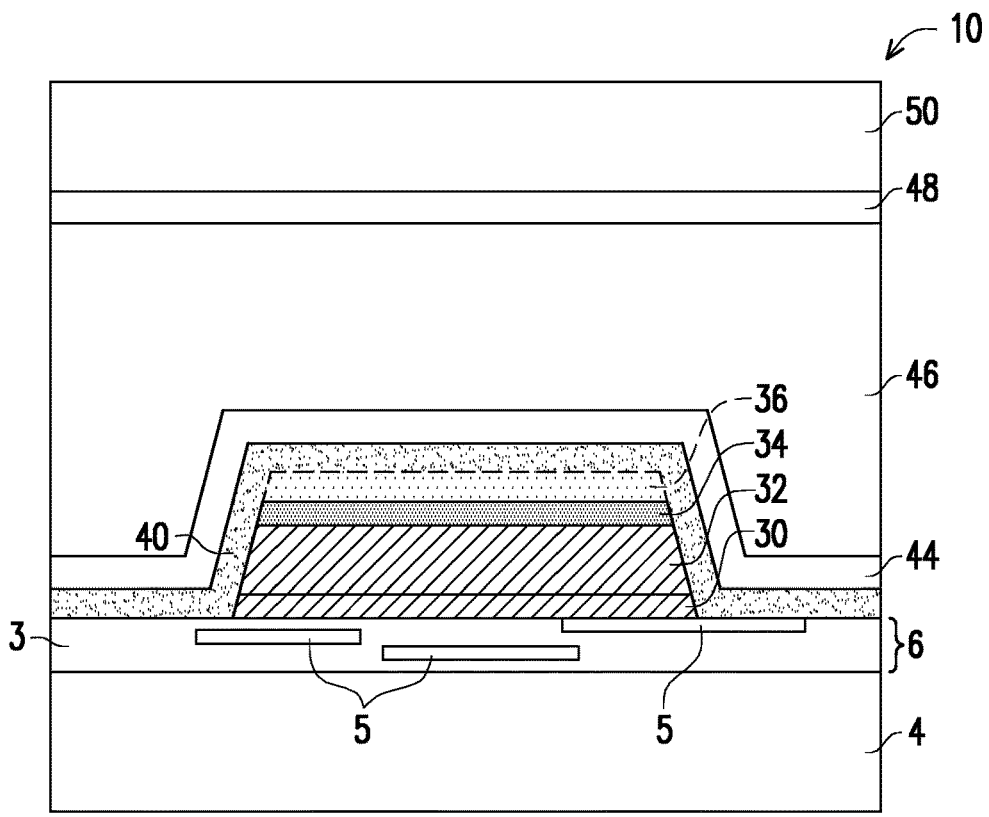
Figure 5D:
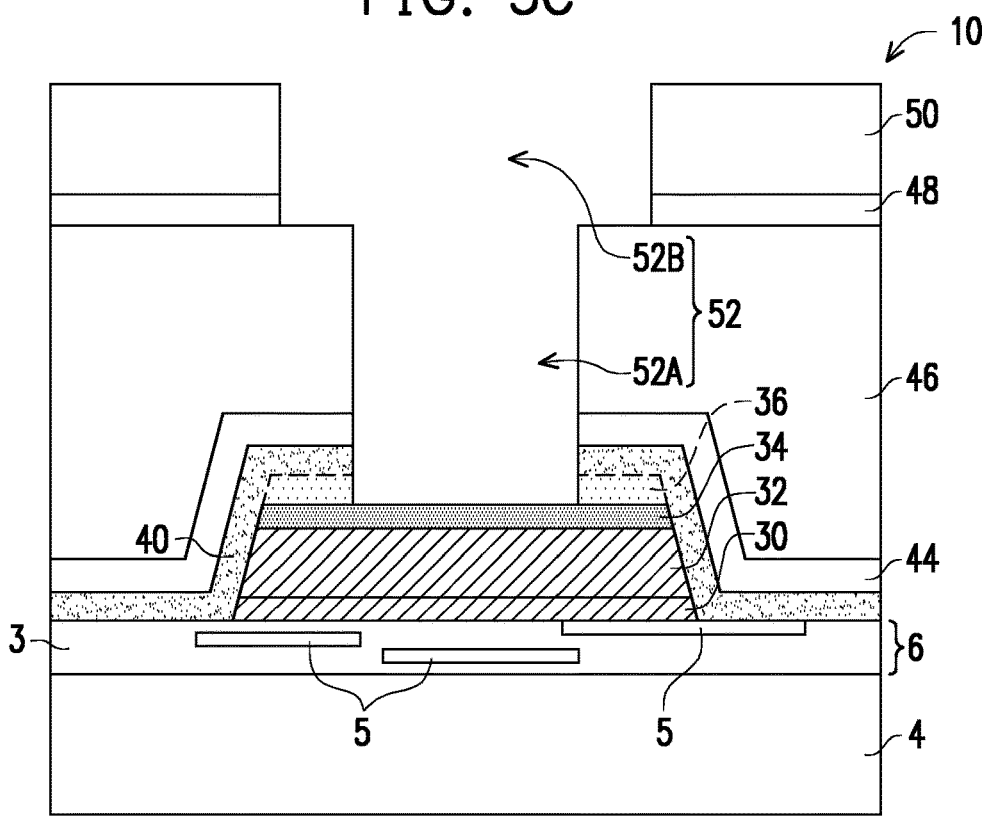
Figure 5E:
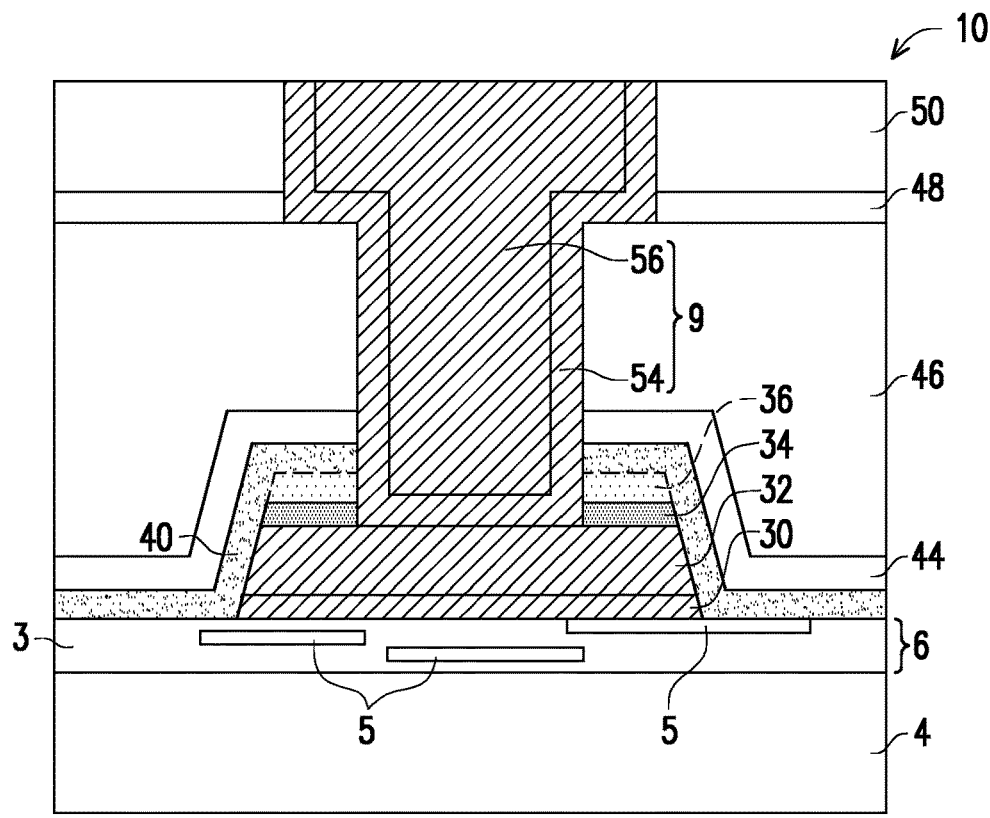

FIGS. 5A through 5F illustrate the formation of a bonding structure in accordance with some embodiments. These embodiments are similar to the embodiments as shown in FIGS. 3A through 3F, except sidewall capping layer 40 further extends on the top surface of interconnect structure 6. Referring to FIG. 5A, diffusion barrier 30, metal pad 32, capping layer 34, and optional BARC 36 are formed over interconnect structure 6. Capping layer 34 may be a dielectric layer, while it may also be a conductive layer. The formation processes are the same as shown in FIGS. 2A-2C, and are not repeated herein. In FIG. 5B, sidewall capping layer 40 is deposited, and may be formed of a conductive material or a dielectric material. Sidewall capping layer 40 may not be patterned in the illustrated region, and accordingly, extends on the top surface of interconnect structure 6. Etch stop layer 44, dielectric layer 46, etch stop layer 48, and dielectric layer 50 are then deposited, as shown in FIG. 5C. Next, openings 52A and 52B are formed, as shown in FIG. 5D. Opening 52A penetrates through sidewall capping layer 40 and BARC 36, with the top surface of capping layer 34 being exposed. A wet pre-cleaning process may be performed, during which capping layer 34 is exposed to the chemical solution used in the wet pre-cleaning process. Metal pad 32 is thus protected from galvanic corrosion. The exposed portion of the capping layer 34 is then removed, for example, in a sputtering process. Electrical connector 9 is then formed, as shown in FIG. 5F. Electrical connector 9 has a bottom surface in contact with the top surface of metal pad 32. The removal of the exposed portion of capping layer 34 and the deposition of diffusion barrier 54 may also be in-situ performed.

FIGS. 6A, 6B, 6C, 7A, 7B, 7C, 8, and 9 illustrate the cross-sectional view of the bonding structures in accordance with alternative embodiments. These embodiments are similar to the preceding embodiments, and include the sidewall capping layer 40 extending on top of metal pad 32.

Figure 6A:
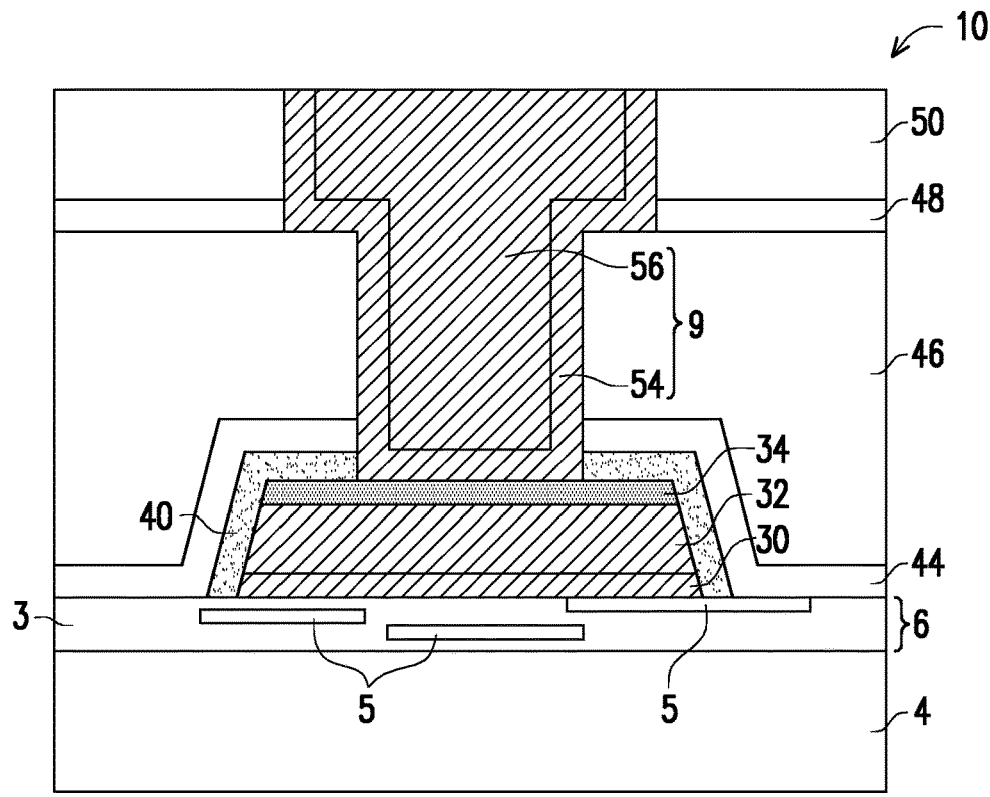
FIGS. 6A-6C illustrate the cross-sectional views of some bonding structures in accordance with some embodiments.
Figure 6B:
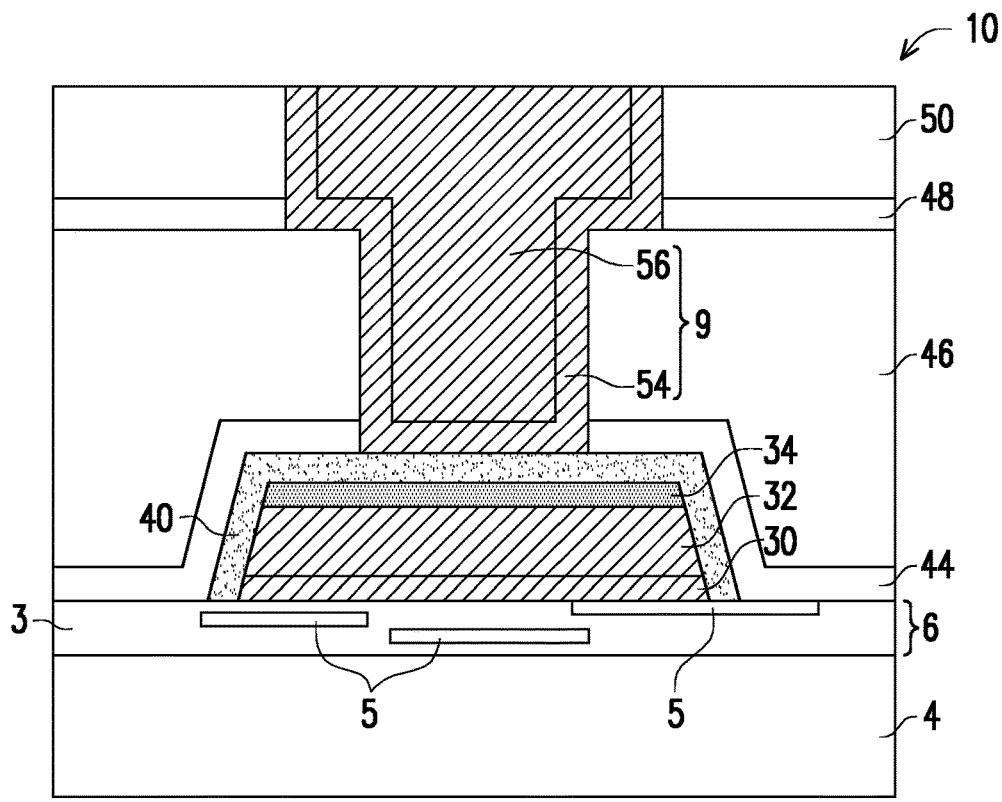
Figure 6C:
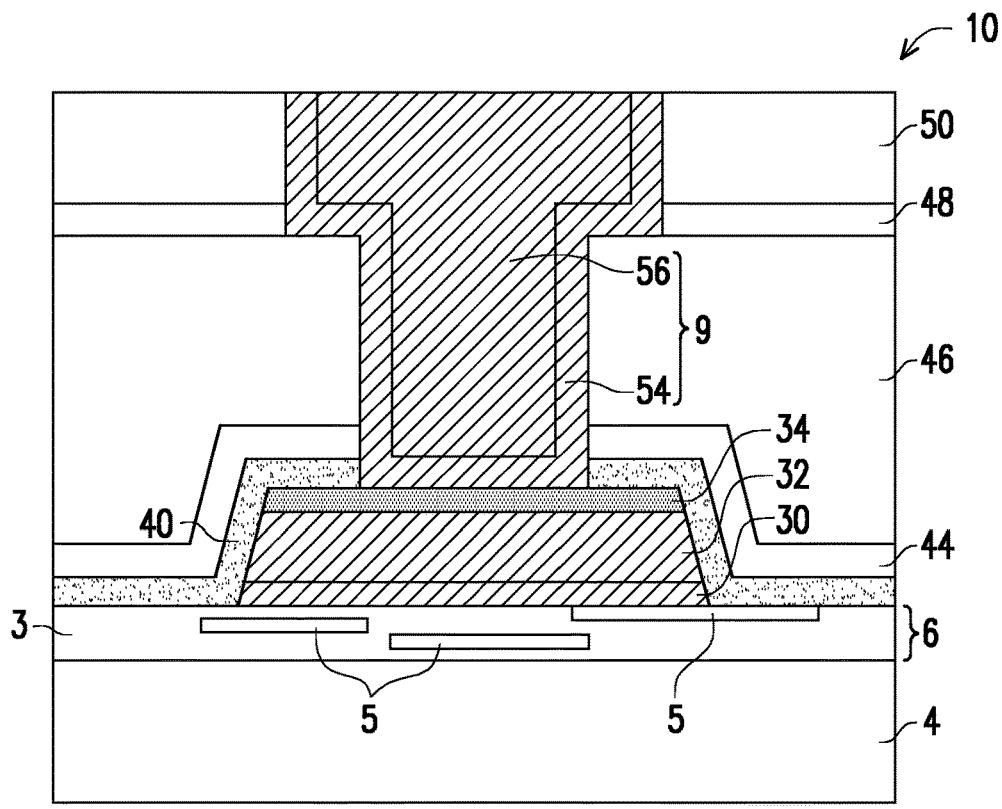
Figure 7A:
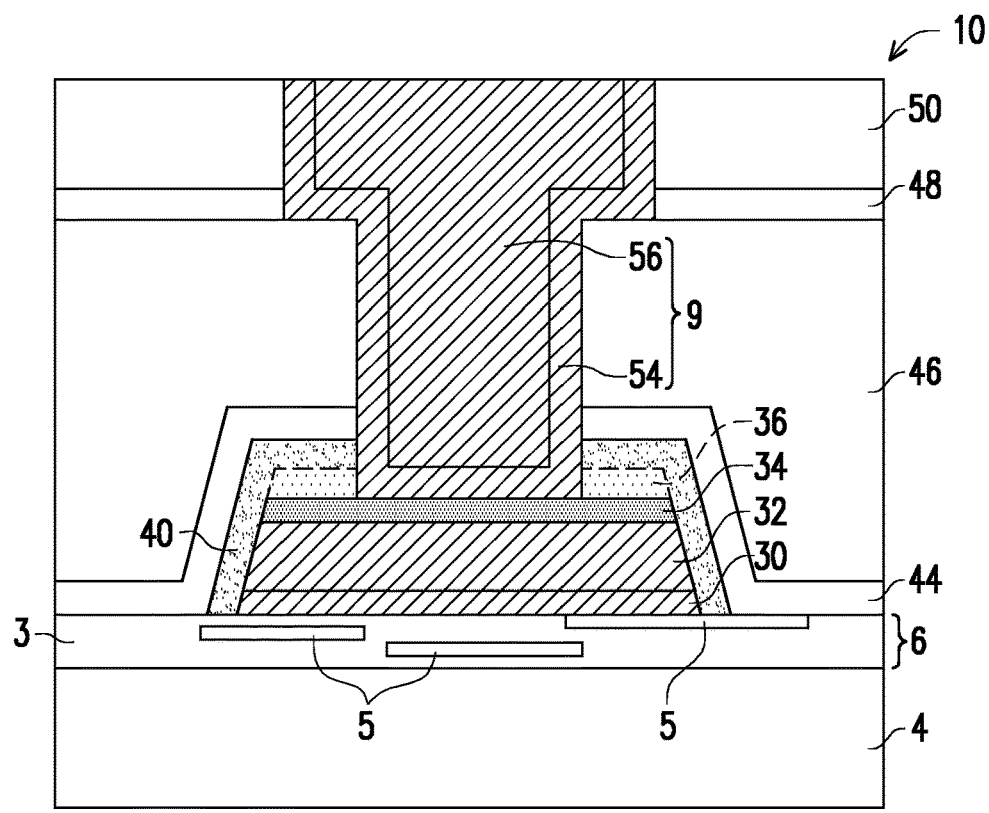
FIGS. 7A-7C illustrate the cross-sectional views of some bonding structures in accordance with some embodiments.
Figure 7B:
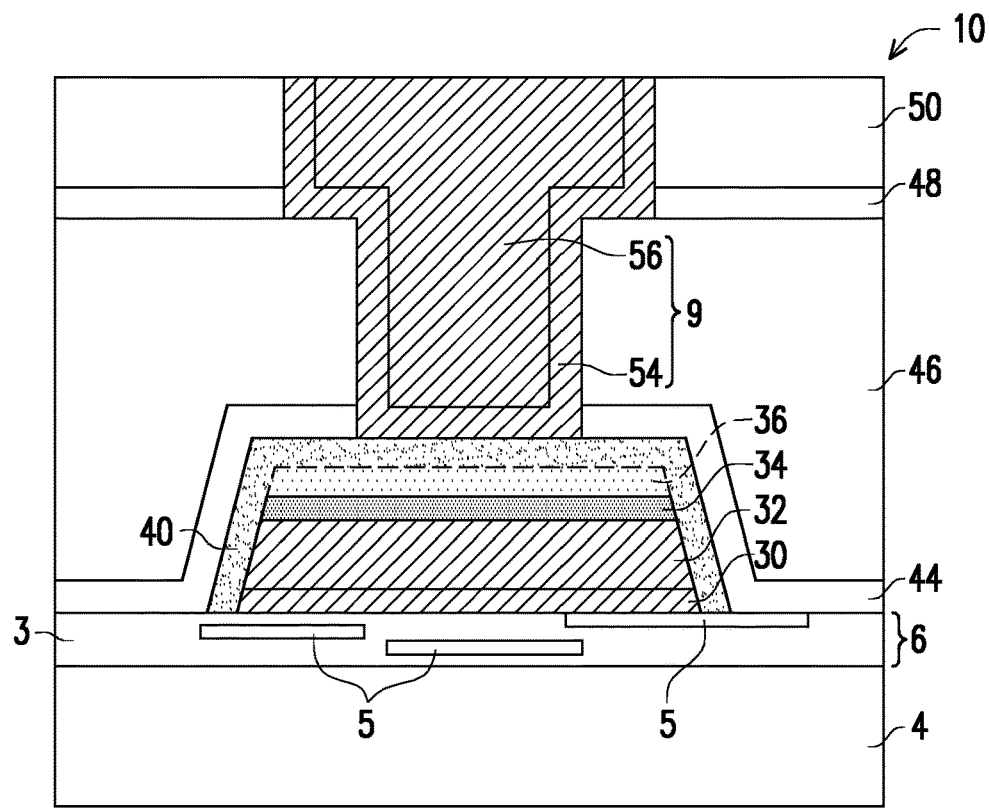
Figure 7C:
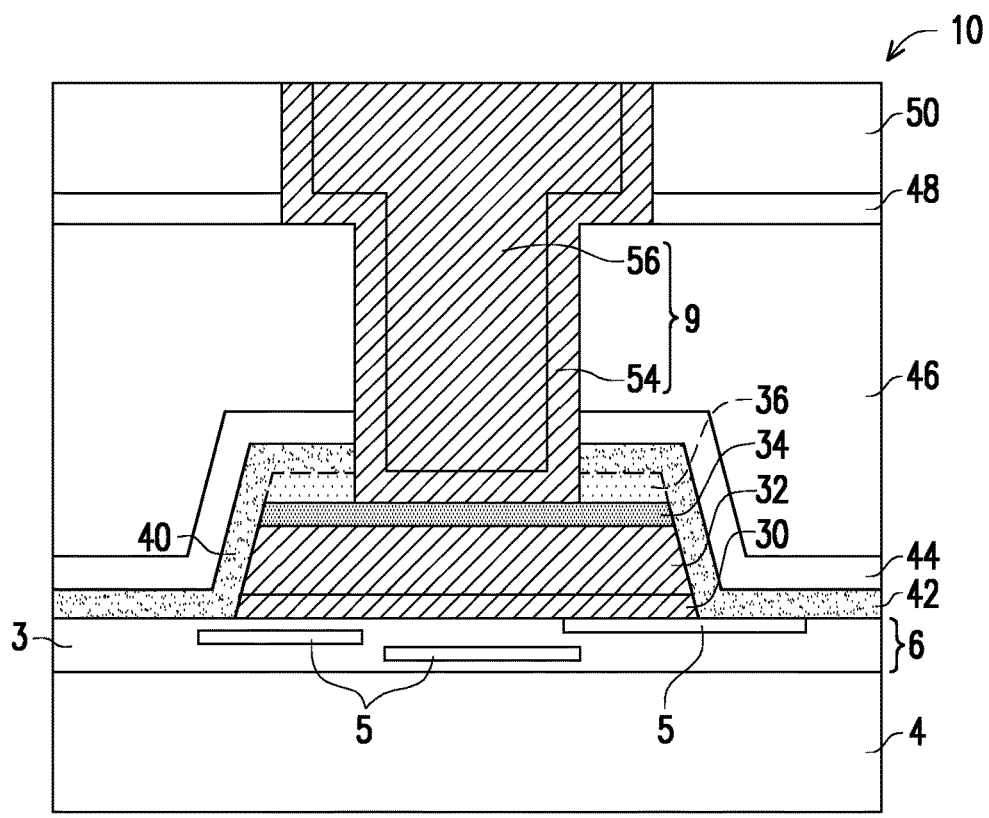

FIGS. 6A, 6B, and 6C illustrate bonding structures in accordance with some embodiments. In the embodiment shown in FIG. 6A, no BARC is left on top of capping layer 34. Electrical connector 9 penetrates through sidewall capping layer 40, which may be a conductive layer or a dielectric layer, and lands on the top surface of capping layer 34, which may also be a conductive layer or a dielectric layer. The available materials of sidewall capping layer 40 and capping layer 34 have been discussed referring to the embodiments shown in FIGS. 2A-2H, and are not repeated herein. In the embodiment shown in FIG. 6B, no BARC is left on top of capping layer 34. Sidewall capping layer 40 may be a conductive layer or a dielectric layer, and electrical connector 9 lands on, without penetrating through, the top portion of conductive sidewall capping layer 40. In the embodiment shown in FIG. 6C, no BARC is left on top of capping layer 34. Sidewall capping layer 40 may be a dielectric layer, which penetrates through sidewall capping layer 40 to land on capping layer 34, which may be a dielectric layer or a conductive layer. Furthermore, sidewall capping layer 40 may be formed of a dielectric material such as $Al_2O_3$ in accordance with some embodiments, and the thickness of the corresponding sidewall capping layer 40 may be greater than about 600 Å to ensure the electrical isolation between adjacent metal pads 32.

FIGS. 6A, 6B, and 6C illustrate some embodiments, in which no BARC is left on the top of capping layer 34. Different from the embodiments in FIGS. 6A, 6B, and 6C, FIGS. 7A, 7B, and 7C illustrate some embodiments in which BARC 36 is left without being removed. In the embodiment shown in FIG. 7A, BARC 36 is left on top of capping layer 34, and electrical connector 9 penetrates through both of BARC 36 and the top portion of sidewall capping layer 40. Sidewall capping layer 40 may be a conductive layer or a dielectric layer. Electrical connector 9 lands on the top surface of capping layer 34, which may also be a conductive layer or a dielectric layer. In the embodiment shown in FIG. 7B, BARC 36 is left on top of capping layer 34. Each of capping layer 34 and sidewall capping layer 40 may be a conductive layer or a dielectric layer, and electrical connector 9 lands on, without penetrating through, the conductive sidewall capping layer 40. In the embodiment shown in FIG. 7C, sidewall capping layer 40 is a dielectric layer, and extends on the top surface of interconnect structure 6. Electrical connector 9 penetrates through both of sidewall capping layer 40 and BARC 36 to land on capping layer 34, which may be a dielectric layer or a conductive layer. Furthermore, the thickness of sidewall capping layer 40 may be greater than about 600 Å to ensure the electrical isolation between adjacent metal pads 32.

Figure 8:
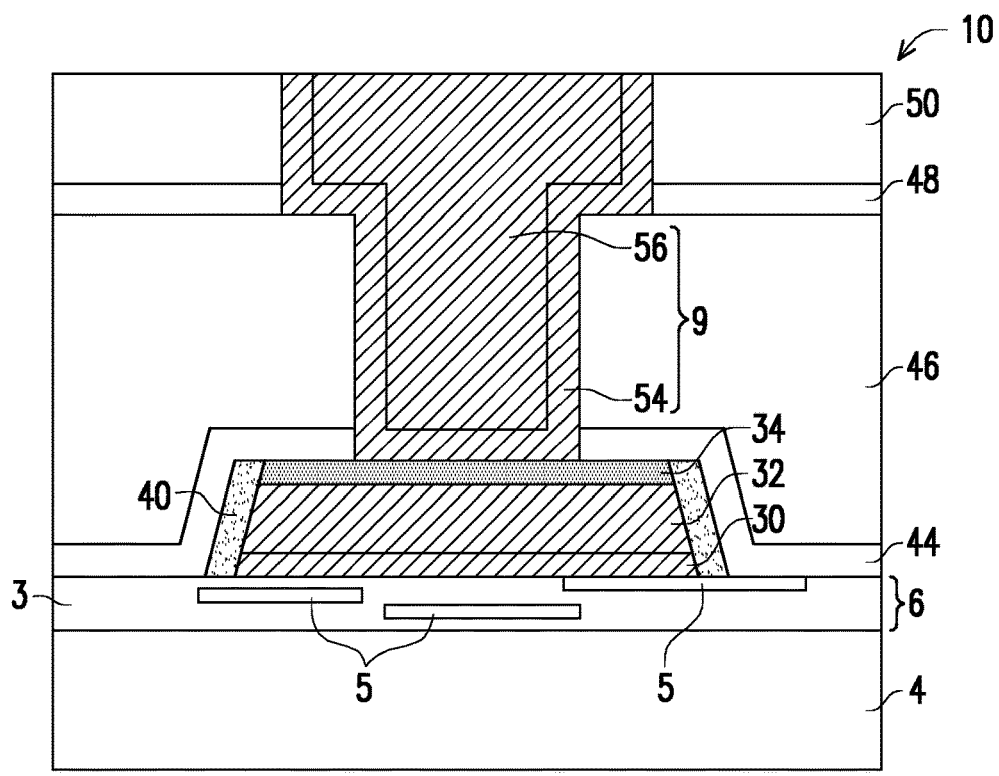
FIGS. 8-9 illustrate the cross-sectional views of some bonding structures in accordance with some embodiments.
Figure 9:
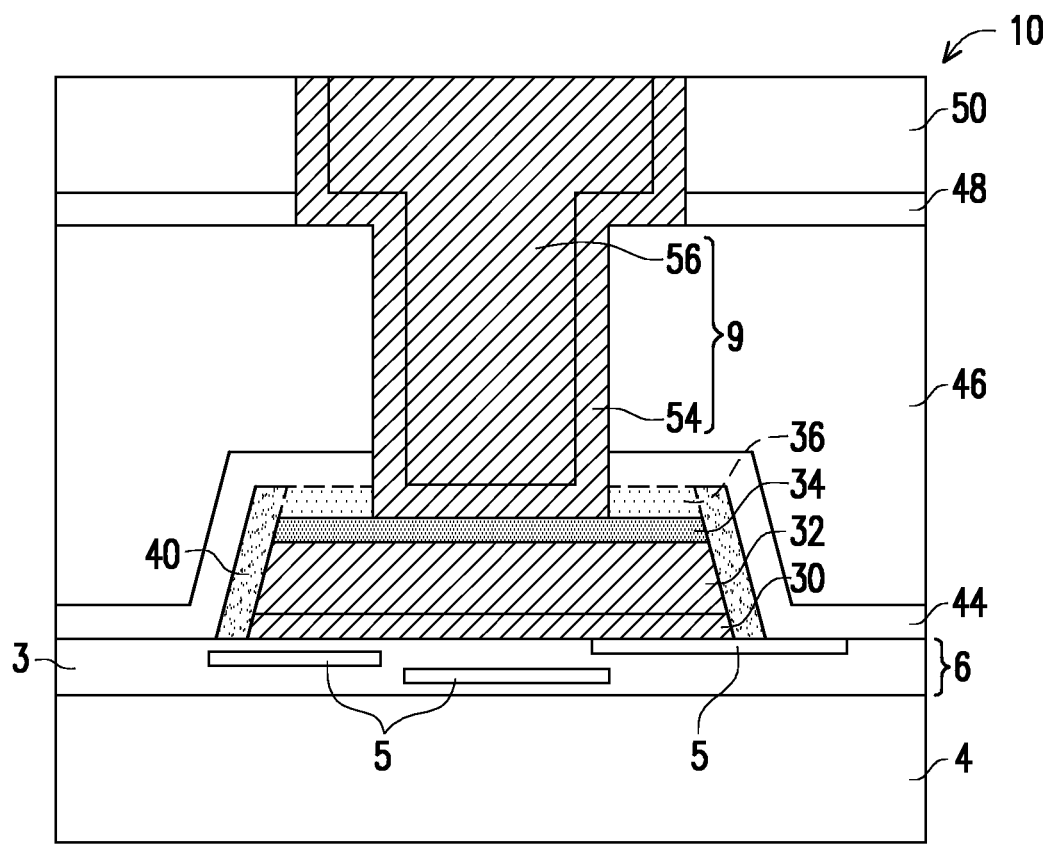

FIGS. 8 and 9 illustrate the cross-sectional view of the bonding structures in accordance with alternative embodiments. These embodiments are similar to the preceding embodiments, and include the sidewall capping layer 40 having vertical portions on the sidewalls of metal pad 32, but does not include horizontal portions on top of capping layer 34. Each of capping layer 34 and sidewall capping layer 40 may be formed of a dielectric material such as aluminum oxide or a conductive material, such as Ti, TiN, Ta, TaN, or the like. In FIG. 8, no BARC is left on top of capping layer 34, which may be a dielectric layer or a conductive layer. In the embodiment shown in FIG. 9, BARC 36 is left on top of capping layer 34. Electrical connector 9 penetrates through BARC 36, and lands on the top surface of capping layer 34.

Figure 10A:
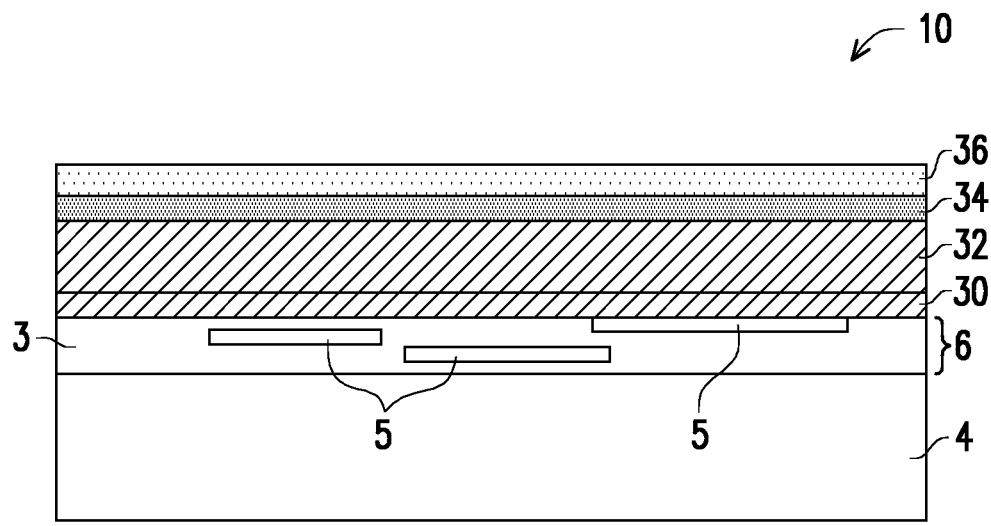
FIGS. 10A-10H illustrate the cross-sectional views of intermediate stages in the formation of a bonding structure in accordance with some embodiments.
Figure 10B:
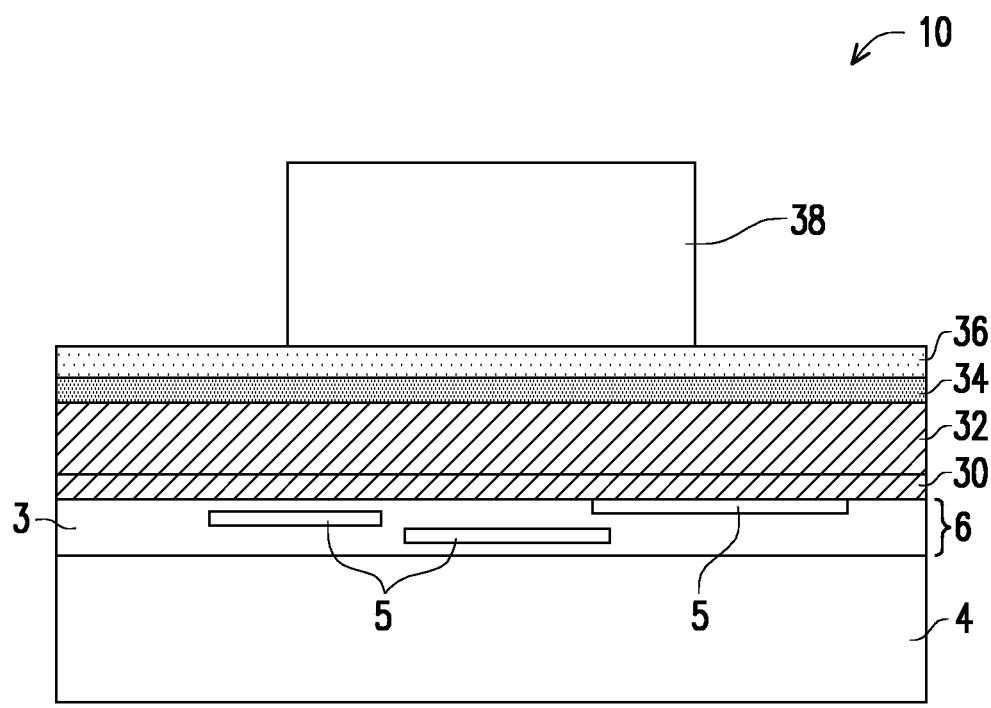
Figure 10C:
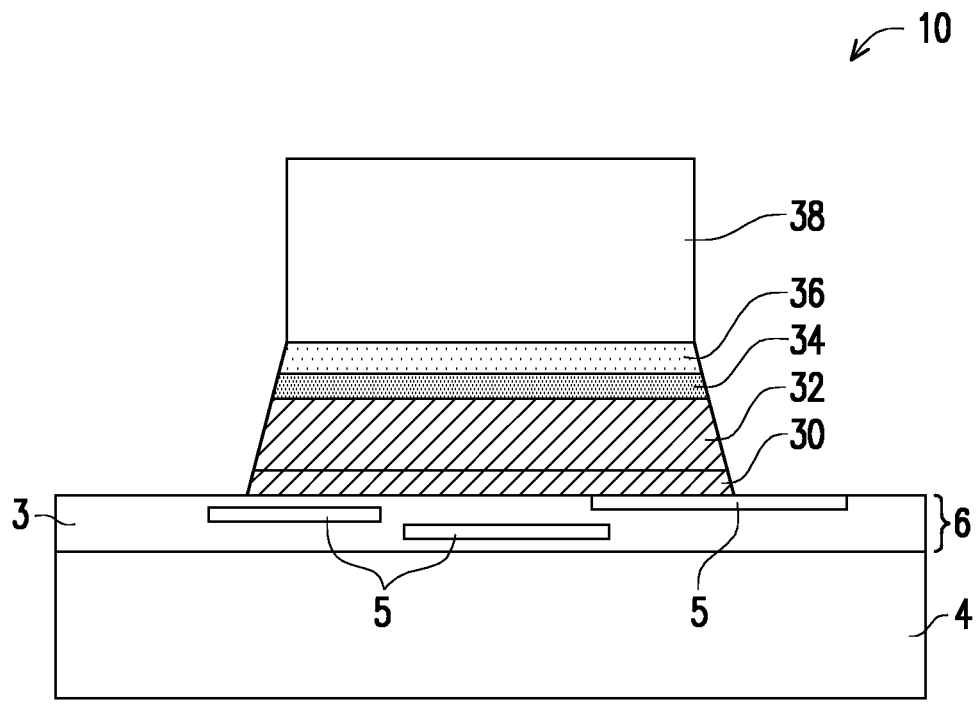
Figure 10D:
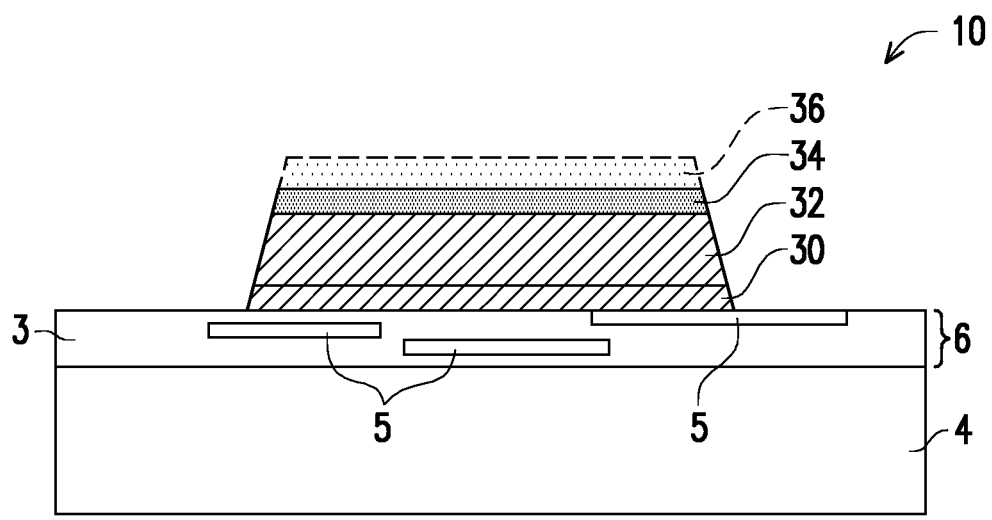
Figure 10E:
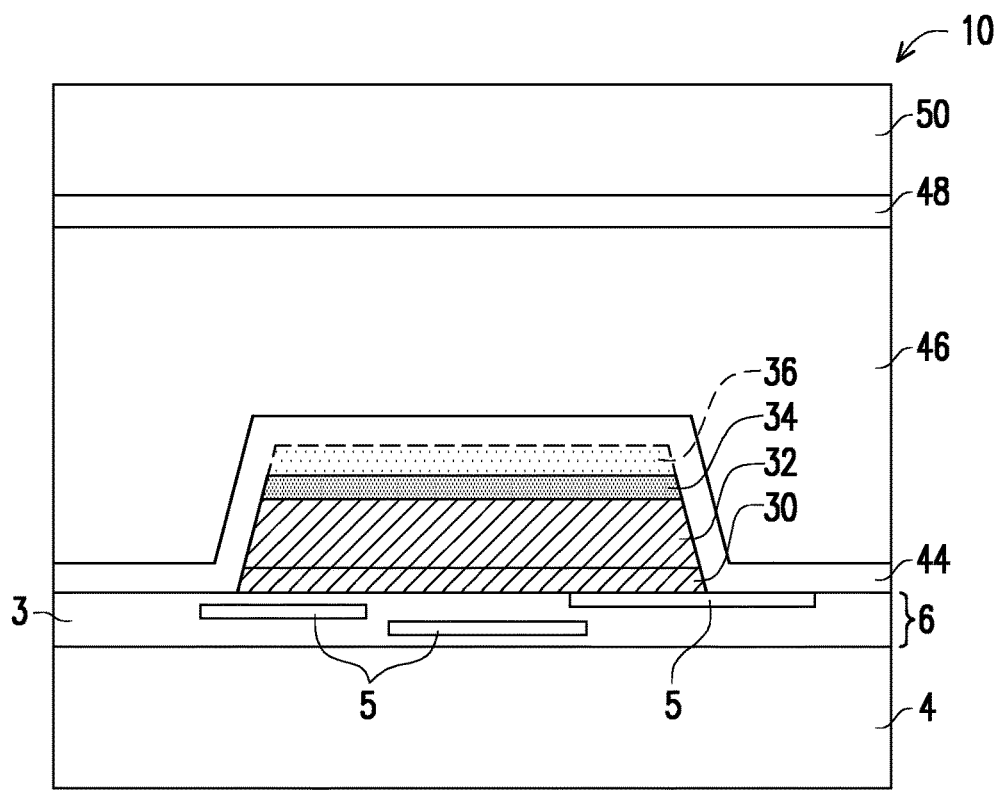
Figure 10F:
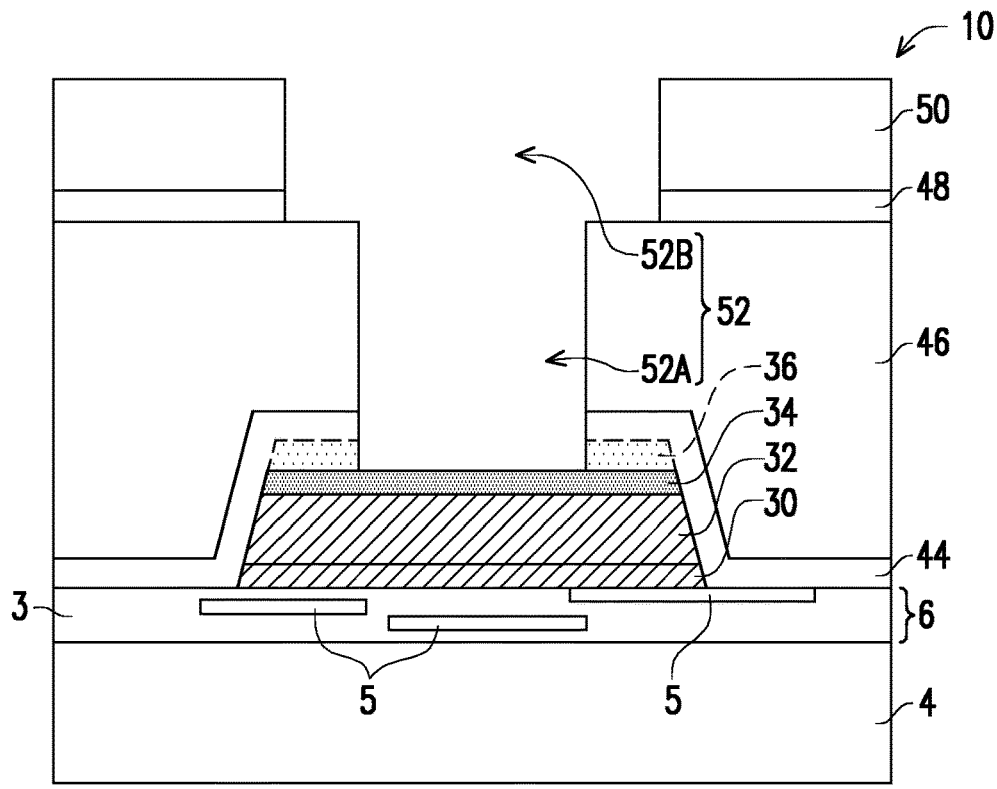

FIGS. 10A through 10H illustrate the formation of a bonding structure in accordance with some embodiments. These embodiments are similar to the embodiments as shown in FIGS. 2A through 2H, except no sidewall capping layer is formed, and electrical connector 9 penetrates through capping layer 34 and BARC 36 (if formed, optional), and lands on the top surface of metal pad 32. FIGS. 10A, 10B, 10C, and 10D are essentially the same as FIGS. 2A, 2B, and 2C, and are not discussed in detail herein. Capping layer 34 may be a dielectric layer or a conductive layer. In FIG. 10E, etch stop layer 44, dielectric layer 46, etch stop layer 48, and dielectric layer 50 are formed. Next, openings 52A and 52B are formed, as shown in FIG. 10F. Opening 52A penetrates through BARC 36 (if any) in the formation of openings 52A and 52B, which may be formed using dry etching processes. The top surface of capping layer 34 is exposed to opening 52A. A wet pre-cleaning process may then be performed, during which capping layer 34 is exposed to the chemical solution used in the wet pre-cleaning process. Metal pad 32 is thus protected from galvanic corrosion.

Figure 10G:
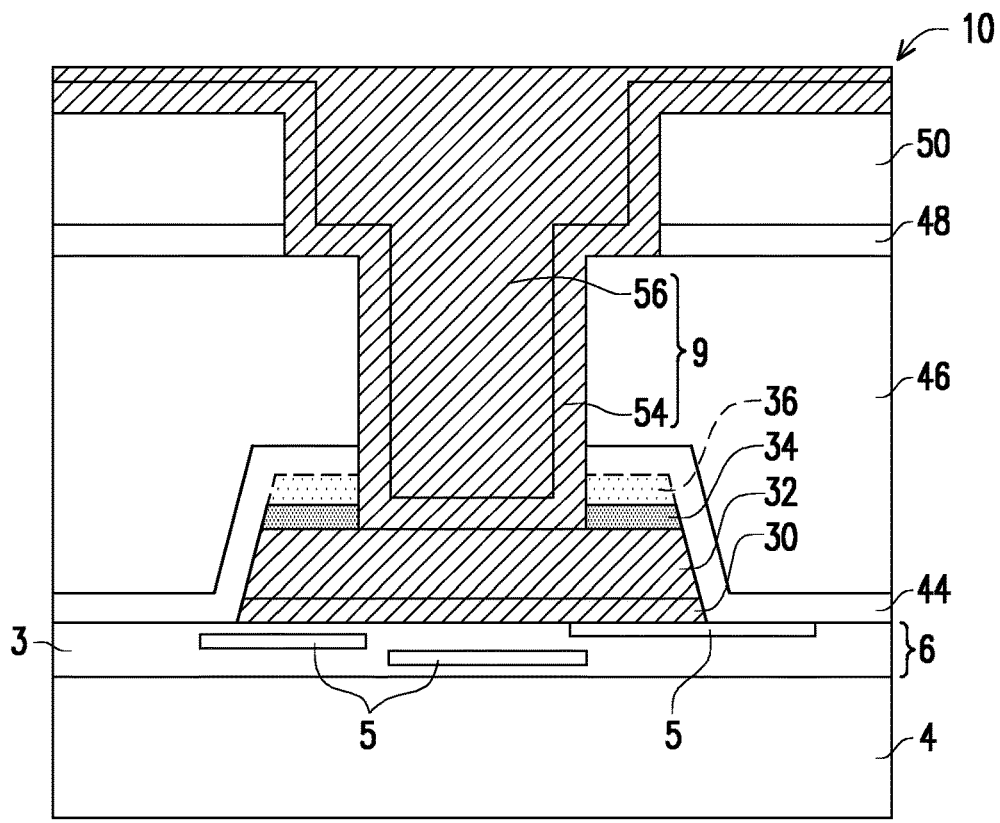
Figure 10H:
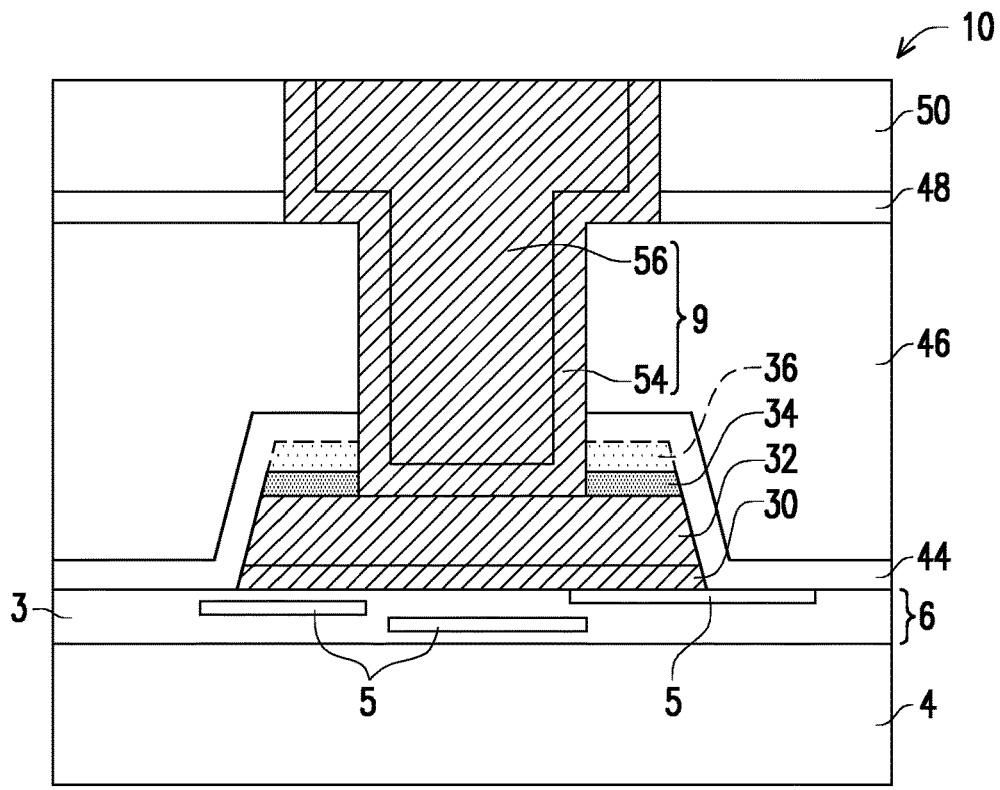

The exposed portion of capping layer 34 is then removed, for example, through sputtering in a process chamber, so that metal pad 32 is exposed. Electrical connector 9 is then formed, as shown in FIGS. 10G and 10H. FIG. 10G illustrates the deposition of diffusion barrier 54 and the formation of metallic material 56. In accordance with some embodiments, diffusion barrier 54 is in-situ deposited in the same production tool (may be in different process chambers that are in a same vacuum environment) as used for removing the exposed portion of capping layer 34, and there may not be vacuum break between the removal (for example, through sputtering) of capping layer 34 and the deposition of diffusion barrier 54. Conductive material 56 is then deposited, for example, through plating. A planarization process such as a CMP process or a mechanical grinding process is then performed to form electrical connector 9, as shown in FIG. 10H. Electrical connector 9 has bottom surface in contact with the top surface of metal pad 32.

Figure 11:
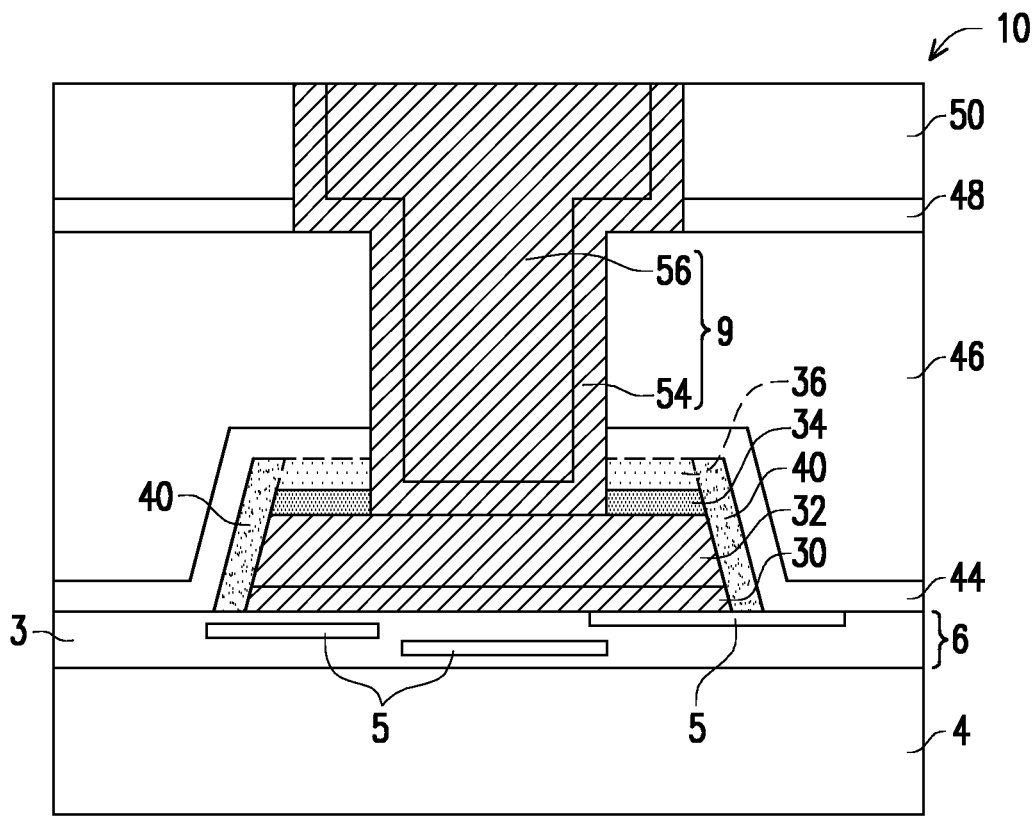
FIG. 11 illustrates the cross-sectional view of a bonding structure in accordance with some embodiments.

FIG. 11 illustrates a bonding structure in accordance with some embodiments. These embodiments are similar to the embodiments as shown in FIG. 10H, except that sidewall capping layer 40 is formed on the sidewalls of diffusion barrier 30, metal pad 32, and capping layer 34. BARC 36 may or may not exist, and if it exists, sidewall capping layer 40 further extends on the sidewalls of BARC 36. Similar to the embodiments in FIG. 10H, electrical connector 9 penetrates through capping layer 34 and lands on metal pad 32. Again, capping layer 34 protects metal pad 32 in the corresponding pre-cleaning process from galvanic corrosion.

Figure 12A:
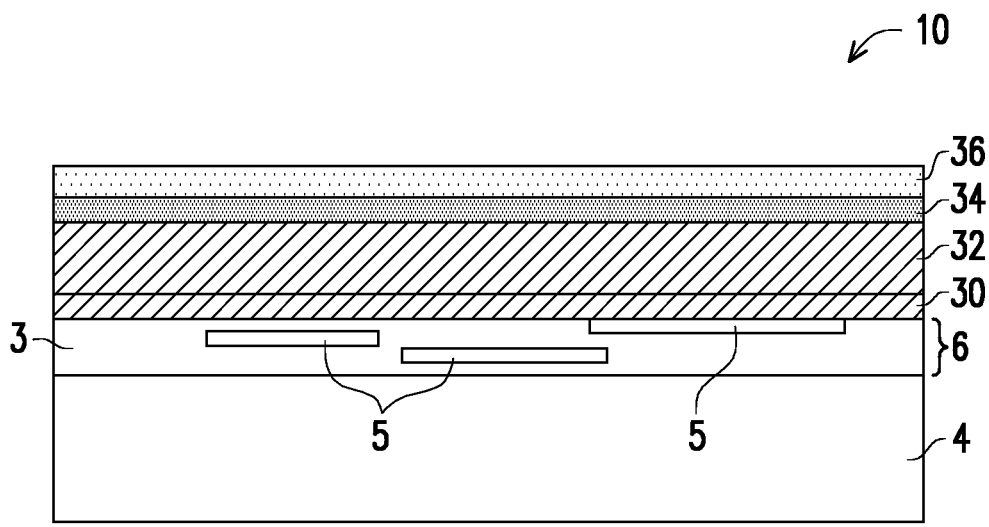
Figure 12B:
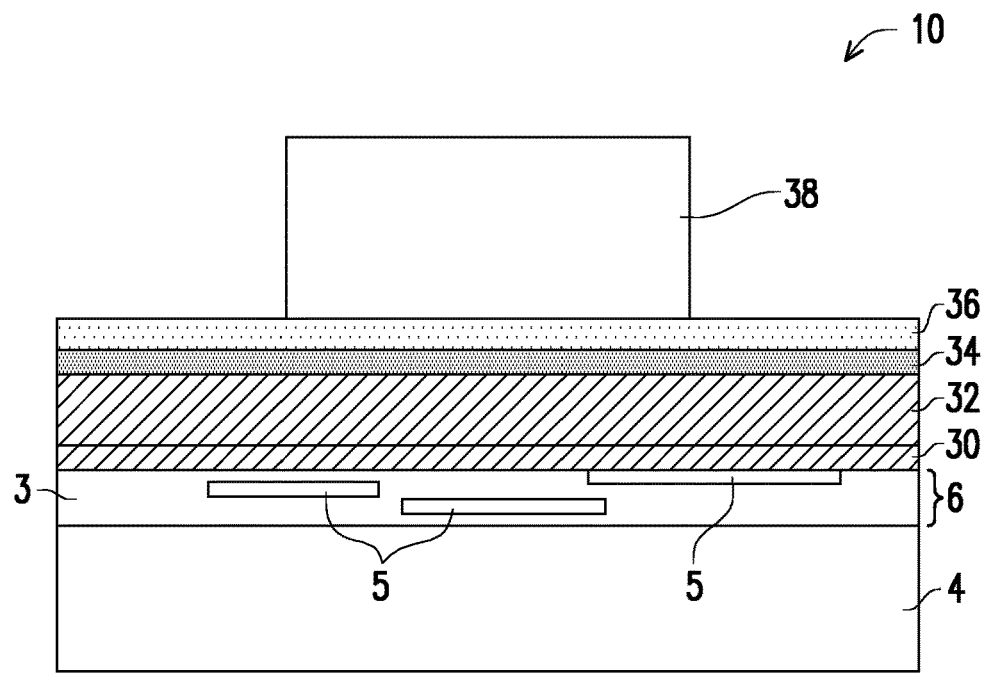
Figure 12C:
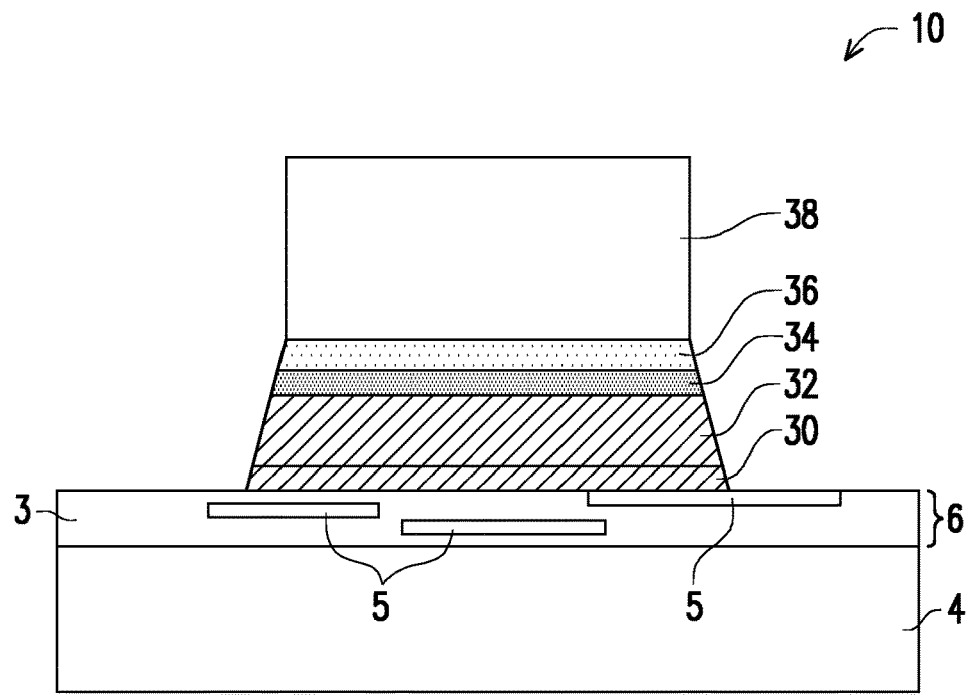
Figure 12D:
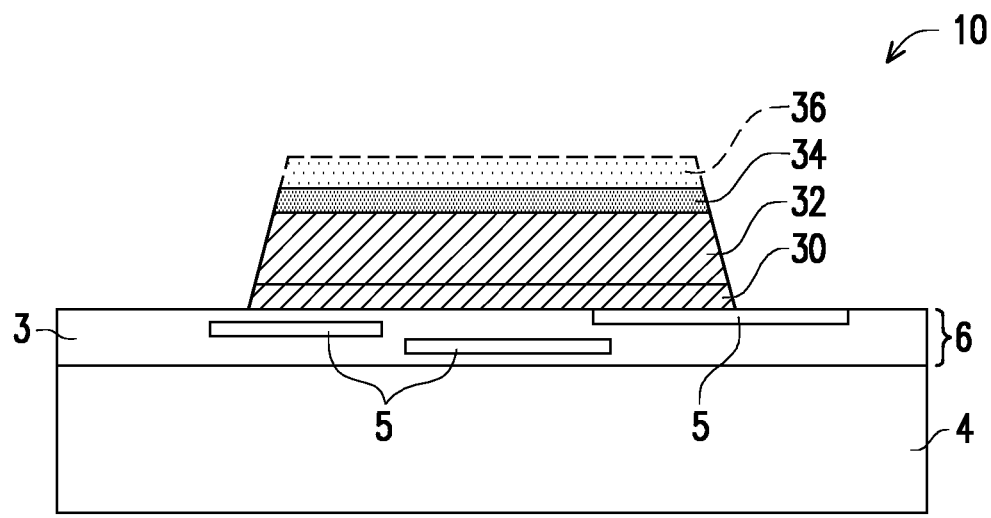
Figure 12E:
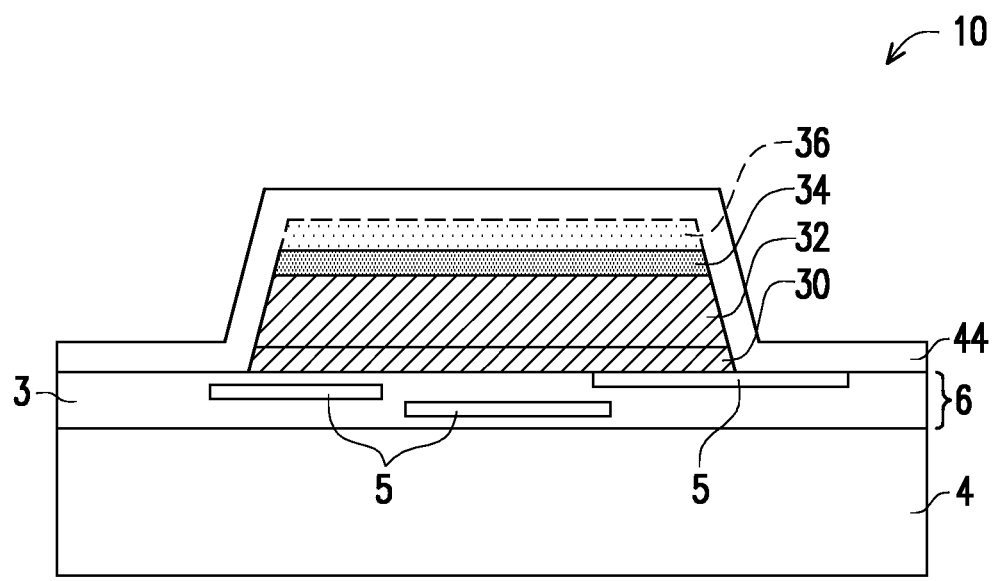
Figures 1, 12F:
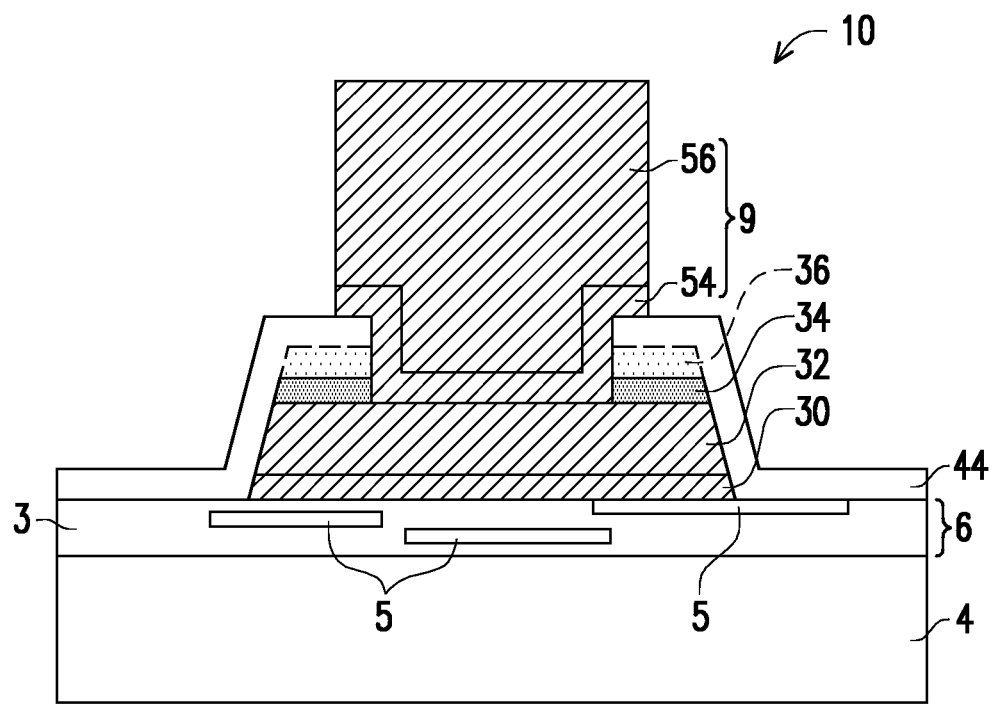

FIGS. 12A through 12F-1 illustrate the formation of a bonding structure in accordance with some embodiments. These embodiments are similar to the embodiments as shown in FIGS. 2A through 2H, except no sidewall capping layer is formed, and the electrical connector 9, instead of being formed using damascene process, is formed using a plating mask. The processes as shown in FIGS. 12A-12D are the same as shown in FIGS. 2A-2C, and the details are not repeated herein. In FIG. 12E, dielectric layer 44 is formed, which may be formed as a conformal layer. Next, as shown in FIG. 12F-1, electrical connector 9 is formed. In accordance with some embodiments, the formation of electrical connector 9 includes etching dielectric layer 44 and BARC 36 (if exists) to form an opening, and performing a wet pre-cleaning process. During the wet pre-cleaning process, capping layer 34 protects the underlying metal pad 32 from galvanic corrosion. The exposed portion of capping layer 34 is then removed in a process chamber, for example, through sputtering. A metal seed layer is then in-situ formed (for example, using PVD) in the same production tool (may be in different process chambers that are in a same vacuum environment) as for removing capping layer 34, with no vacuum break therebetween. The metal seed layer may include a diffusion barrier 54 (for example, formed of titanium), and a copper layer over the diffusion barrier. A patterned plating mask is then formed, with an opening formed in the plating mask and overlapping the opening formed in preceding processes. Conductive material 56 is then plated, followed by the removal of the plating mask, and etching the metal seed layer previously covered by the plating mask. The remaining portions of the metal seed layer and the plated material are electrical connector 9. In the embodiments shown in FIG. 12F-1, electrical connector 9 has a bottom surface in contact with the top surface of metal pad 32.

Figures 2, 12F:
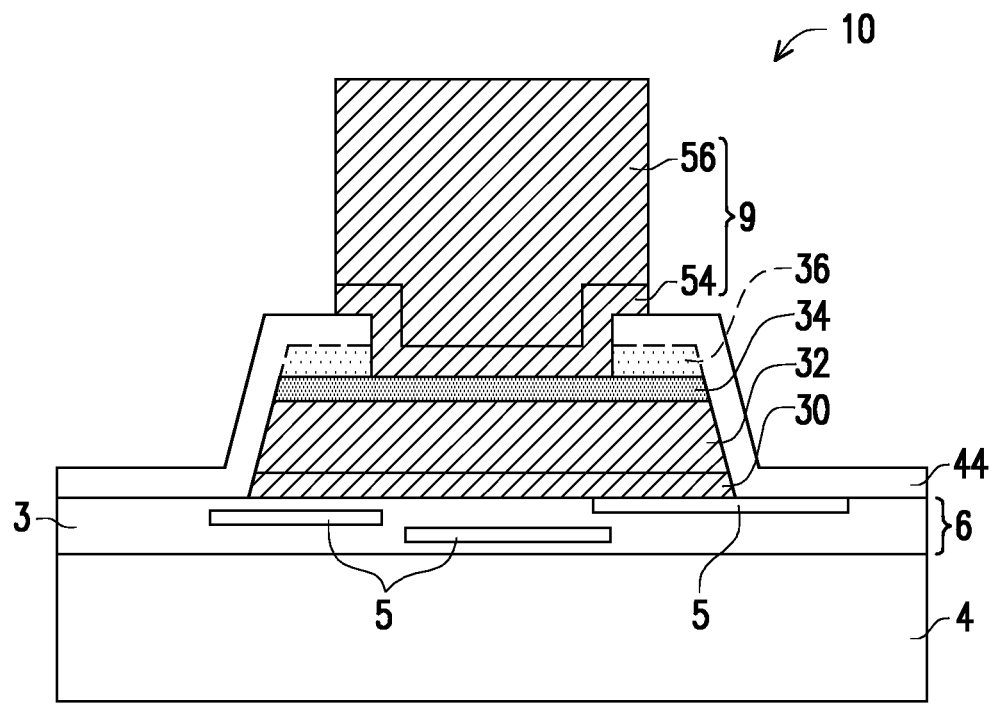

FIG. 12F-2 illustrates a bonding structure in accordance with alternative embodiments. These embodiments are similar to the embodiments as shown in FIG. 12F-1, except that electrical connector 9 lands on the top surface of capping layer 34, which may be formed of a conductive material or a dielectric material. The formation of the structure in FIG. 12F-2 may also include the processes shown in FIGS. 12A-12E.

Figure 13A:
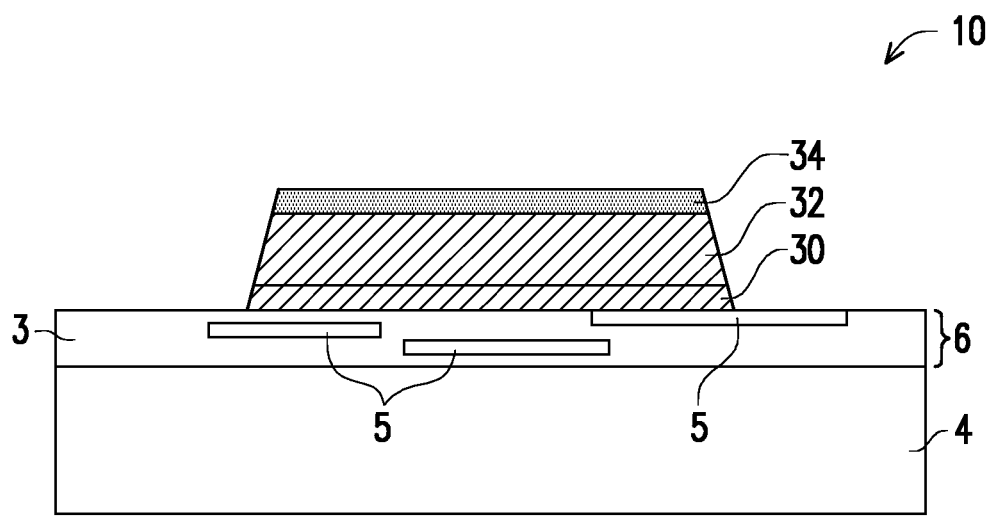
FIGS. 13A-13D illustrate the cross-sectional views of intermediate stages in the formation of a bonding structure in accordance with some embodiments.
Figure 13B:
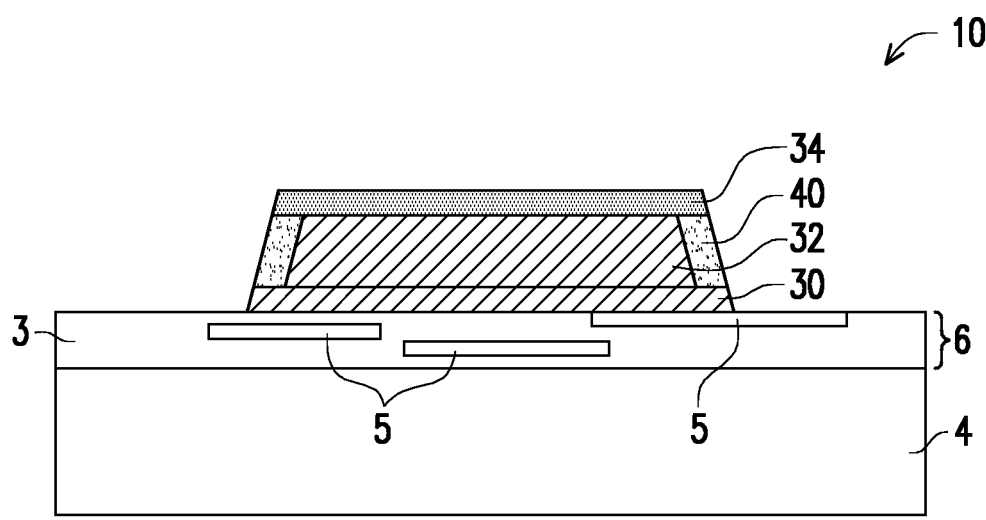

FIGS. 13A through 13D illustrate the formation of a bonding structure in accordance with some embodiments. These embodiments are similar to the embodiments as shown in FIGS. 2A through 2H, except that sidewall capping layer 40, instead of being formed through deposition, is formed by oxidizing the sidewall surface portions of metal pad 32 to form a metal oxide. Referring to FIG. 13A, diffusion barrier 30, metal pad 32, and capping layer 34 are formed. Capping layer 34 may be a conductive layer or a dielectric layer. Next, as shown in FIG. 13B, an oxidation process is performed, so that the sidewall surface portions of metal pad 32 are oxidized to form sidewall capping layer 40. Depending on the material of metal pad 32, sidewall capping layer 40 may be formed of or comprises copper oxide, aluminum oxide, or the combinations thereof, and/or the oxides of other metals. Although not shown in specific, the sidewall portions of diffusion barrier 30 and capping layer 34 may also include the oxide of the corresponding material, which oxide is formed in the oxidation process.

Figure 13C:
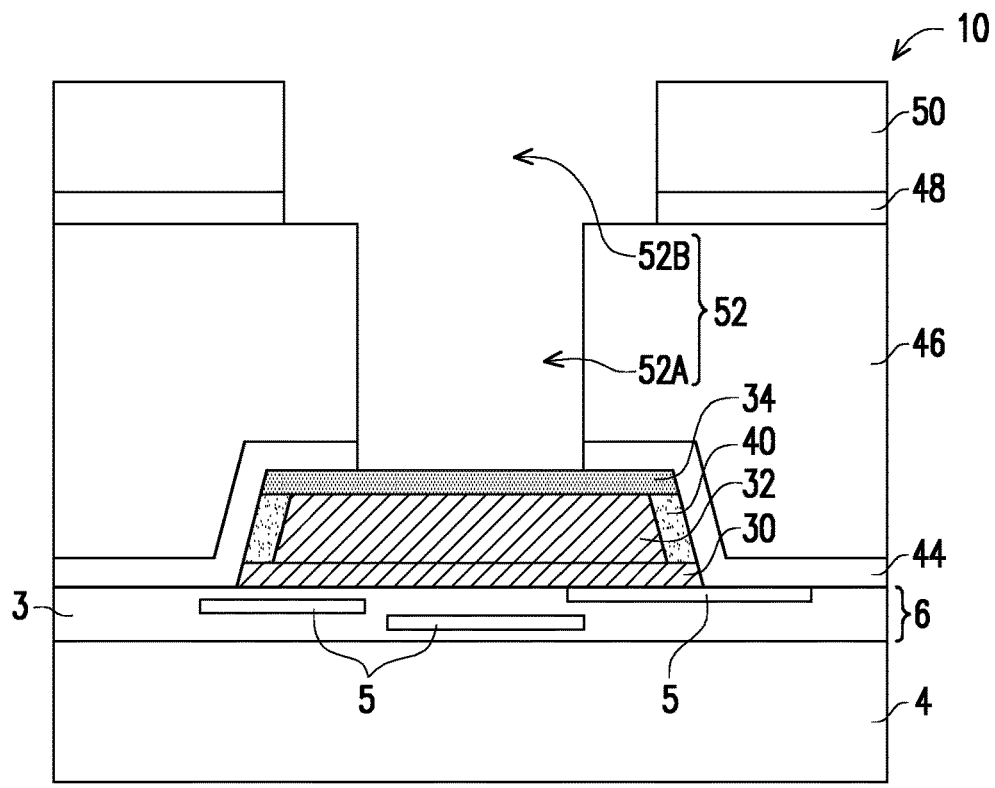

In FIG. 13C, etch stop layer 44, dielectric layer 46, etch stop layer 48, and dielectric layer 50 are deposited, followed by the formation of openings 52A and 52B which are performed in a plurality of etching processes. Opening 52A penetrates through etch stop layer 44, with the top surface of capping layer 34 exposed. A wet pre-cleaning process may then be performed, during which capping layer 34 protects the metal pad 32 from galvanic corrosion. Next, electrical connector 9 is formed in a damascene process, as shown in FIG. 13D.

Figure 13D:
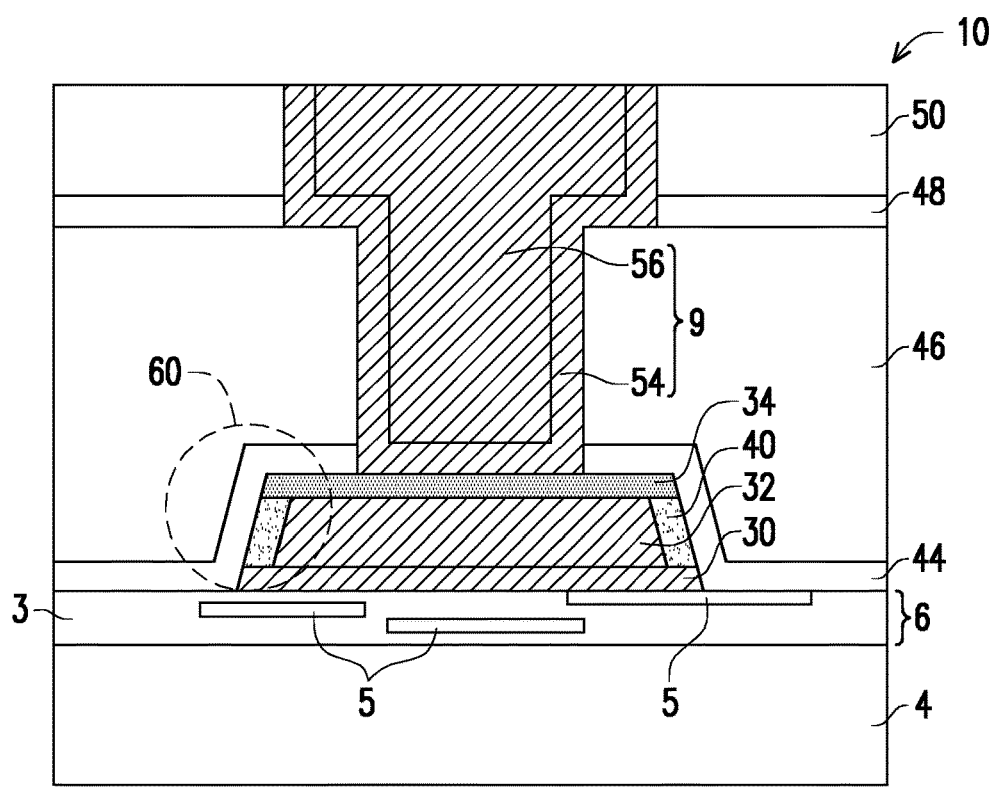
Figures 1, 13D:
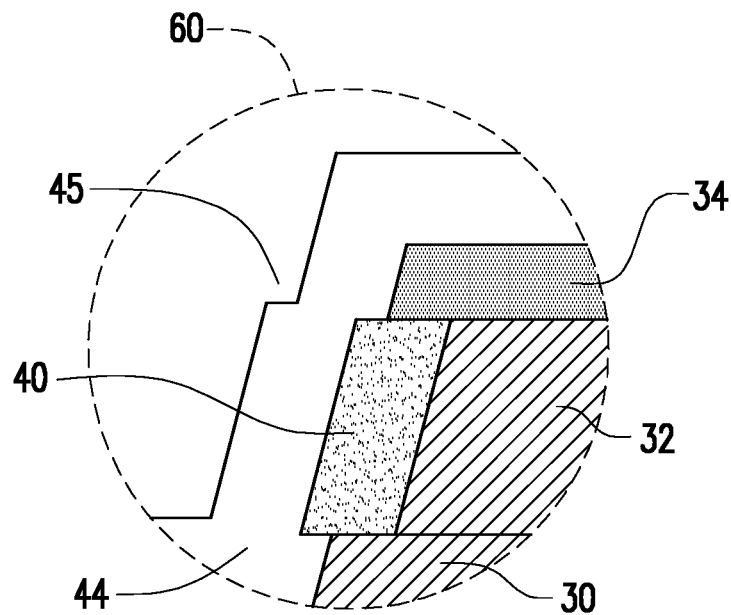

FIG. 13D-1 illustrates an amplified view of the region 60 in FIG. 13D. Due to the adding of oxygen into metal pad 32 in the oxidation to form sidewall capping layer 40, sidewall capping layer 40 has a greater volume than the oxidized portion of metal pad 32. Accordingly, sidewall capping layer 40 expands laterally, and includes a first portion overlapped by the overlying capping layer 34, and a second portion extending beyond the edge of capping layer 34. Since etch stop layer 44 is formed conformally, the topology of sidewall capping layer 40 and capping layer 34 is reflected on the sidewall of etch stop layer 44. The sidewall of etch stop layer 44 has a step 45, which is at a level close to the top surface level of sidewall capping layer 34.

Figure 13E:
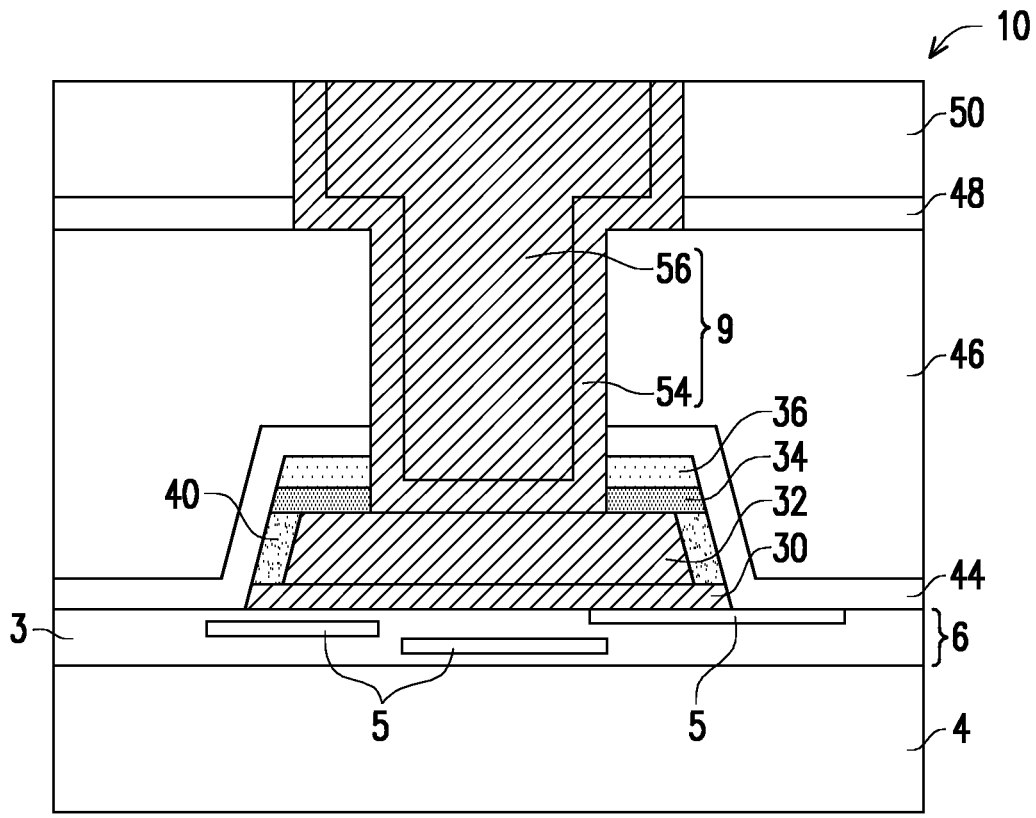
FIGS. 13E and 13F illustrate the cross-sectional views of some bonding structures in accordance with some embodiments.

FIG. 13E illustrates a cross-sectional view of a bonding structure in accordance with some embodiments. These embodiments are similar to the embodiments in FIG. 13D, except BARC 36 is left, and electrical connector 9 penetrates through capping layer 34 to contact metal pad 32. Similarly, the removal of a portion of capping layer 34 in order to reveal metal pad 32 may be performed after a wet pre-cleaning process performed after the revealing of capping layer 34, and performed in-situ with the deposition of diffusion barrier 54.

Figure 13F:
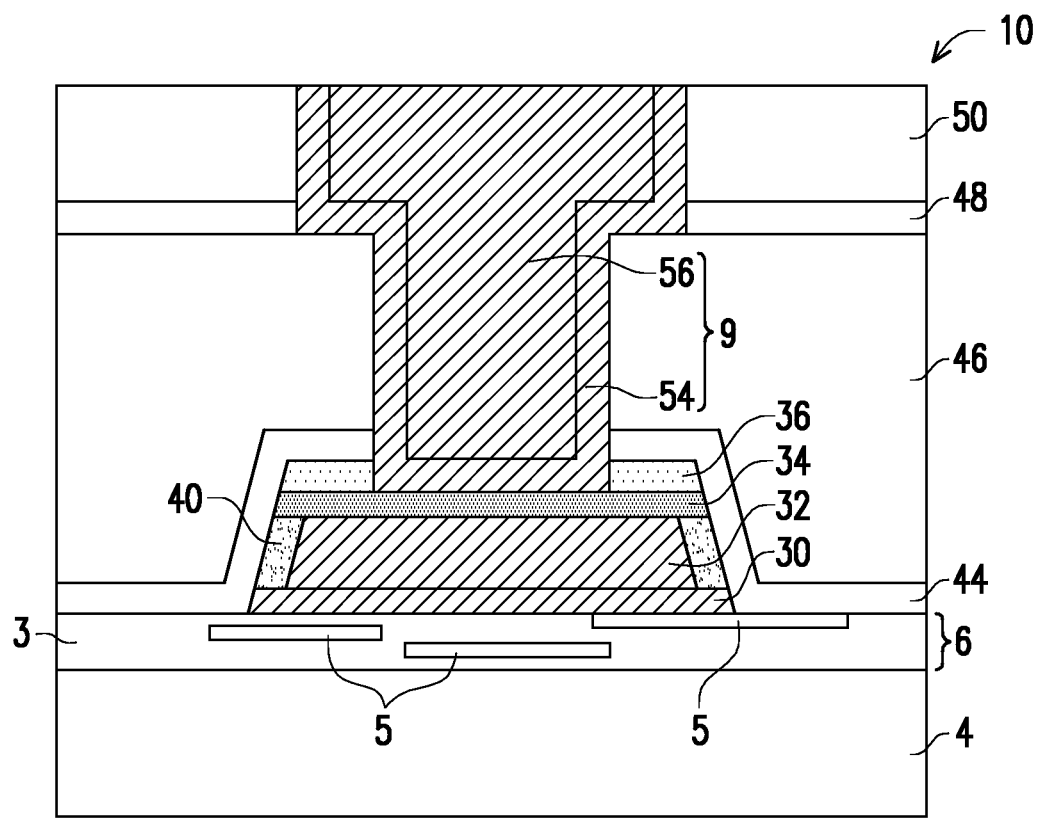

FIG. 13F illustrates a cross-sectional view of a bonding structure in accordance with some embodiments. These embodiments are similar to the embodiments in FIG. 13D, except BARC 36 is left, and electrical connector 9 penetrates through BARC 36 to contact capping layer 34.

Figure 14A:
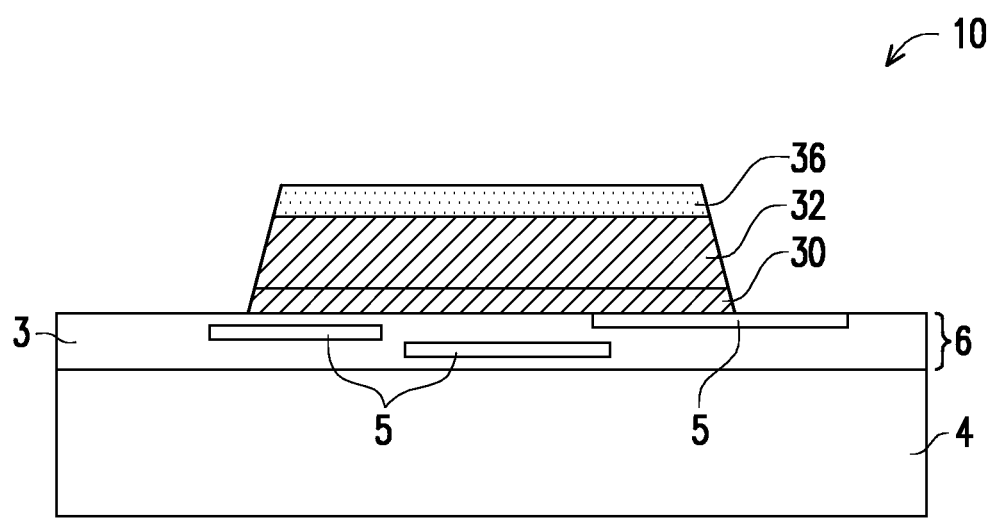
FIGS. 14A-14E illustrate the cross-sectional views of intermediate stages in the formation of a bonding structure in accordance with some embodiments.
Figure 14B:
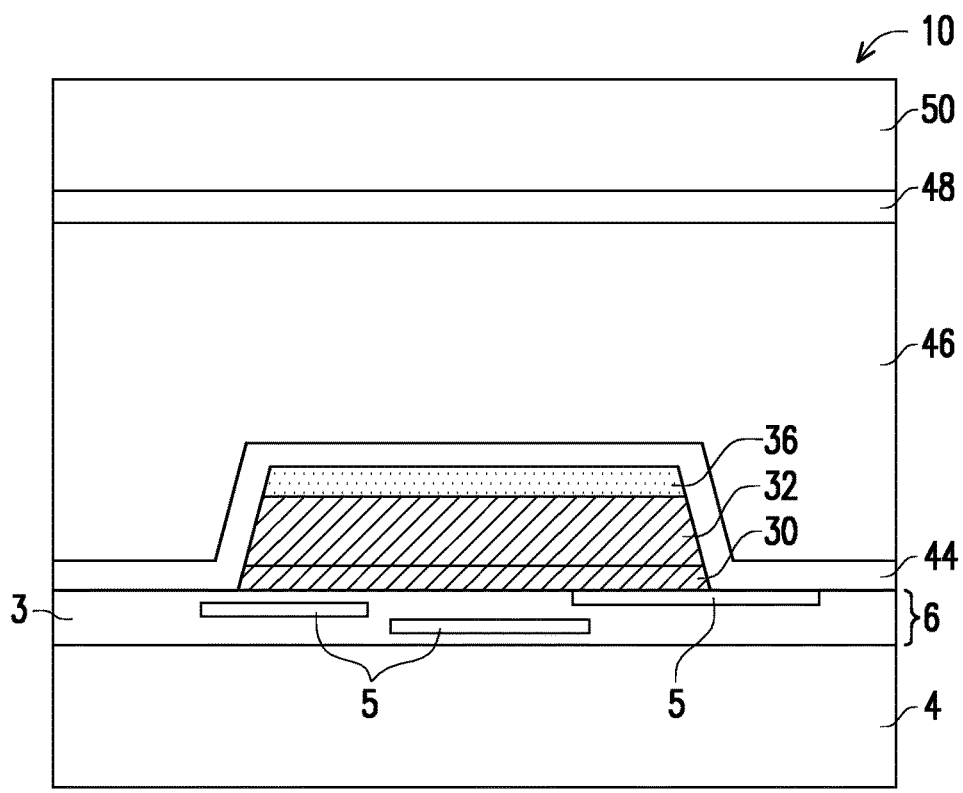
Figure 14C:
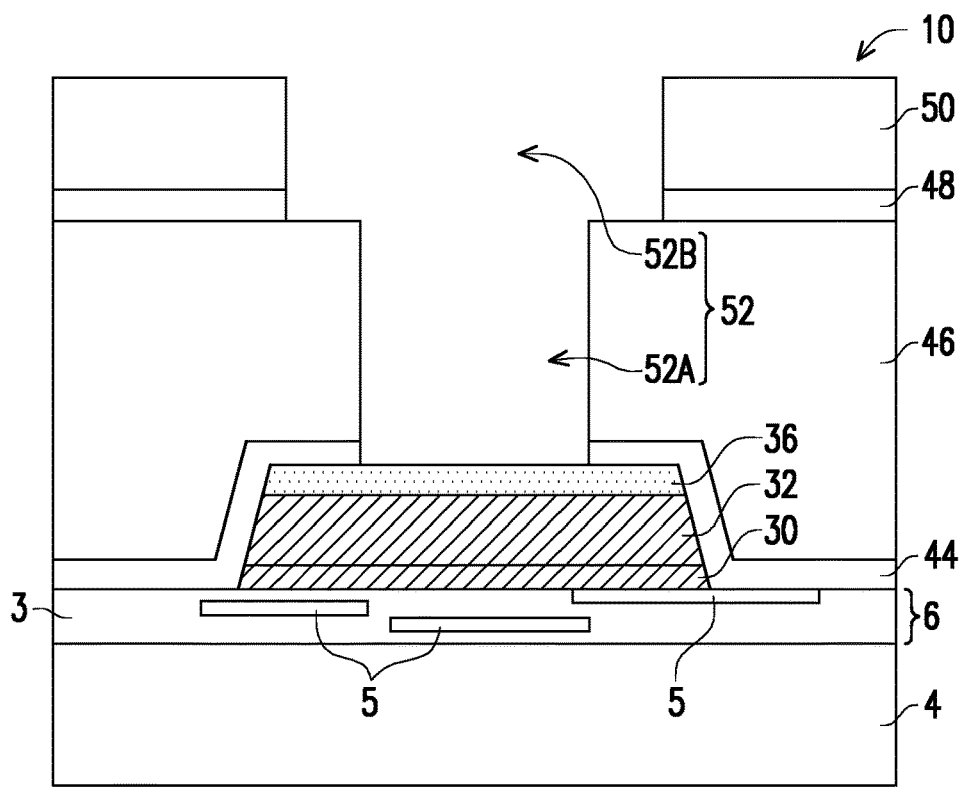
Figure 14D:
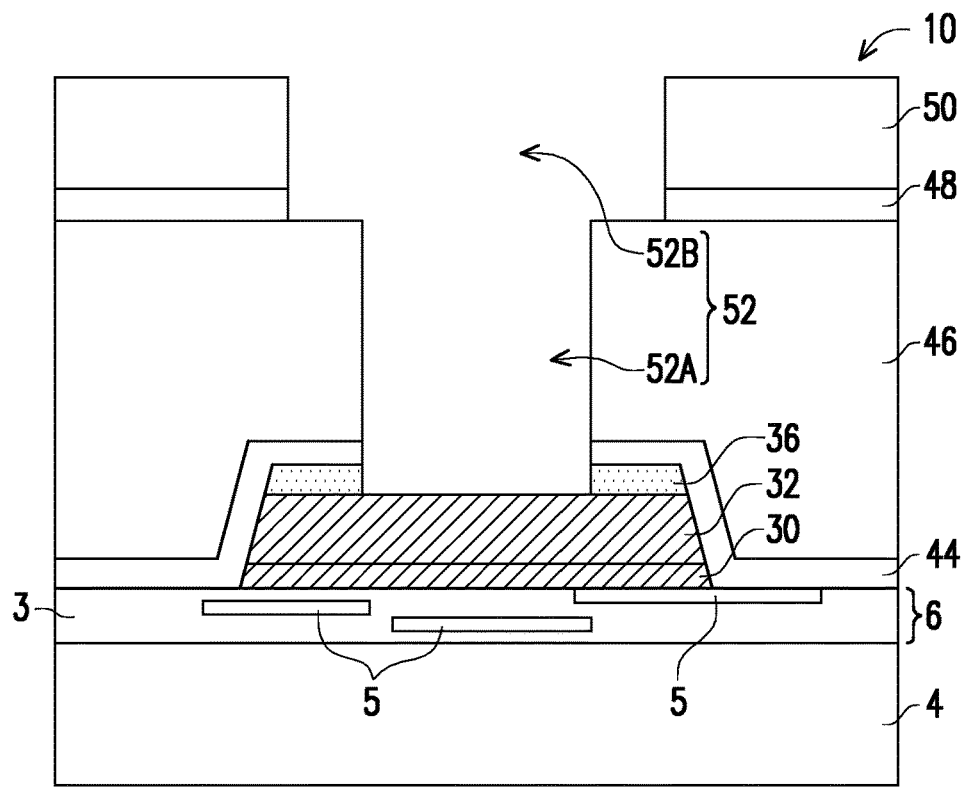
Figure 14E:
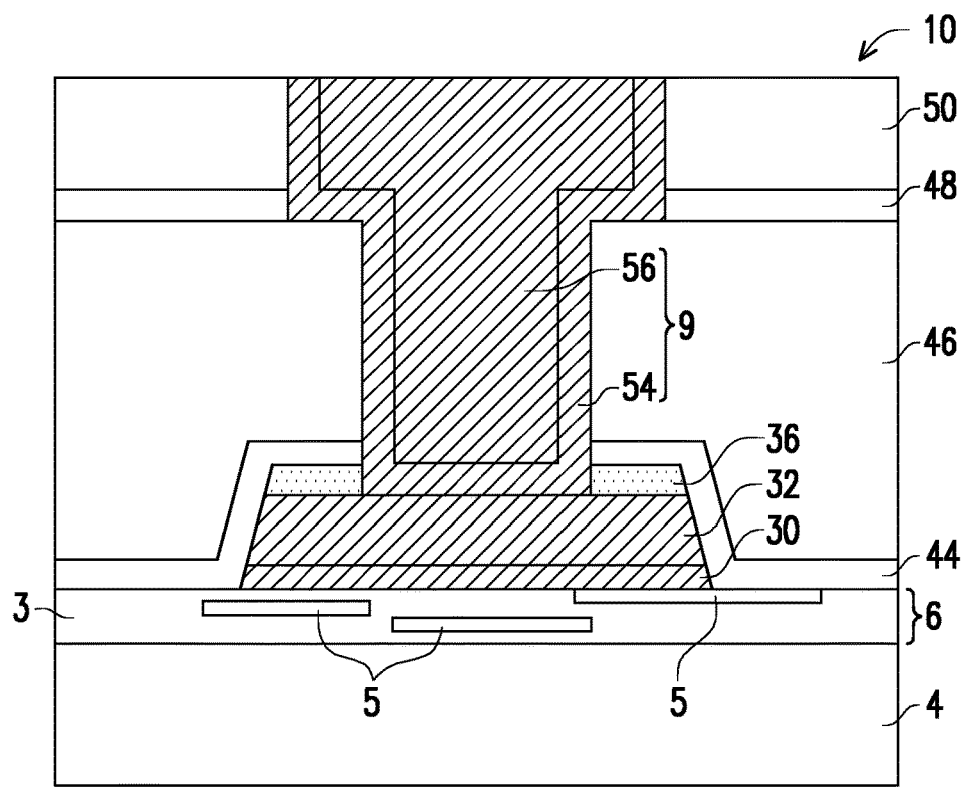

FIGS. 14A through 14E illustrate the formation of a bonding structure in accordance with some embodiments. These embodiments are similar to the embodiments as shown in FIGS. 2A through 2H, except that sidewall capping layer 40 and capping layer 34 as shown in FIG. 2H are not formed. Rather, BARC 36 acts as a capping layer to protect metal pad 32 from galvanic corrosion. FIG. 14A illustrates the formation of an initial structure. The formation process are similar to what are shown in FIGS. 2A-2C, except the capping layer 34 as shown in FIG. 2C is not formed. BARC 36 is left unremoved. In FIG. 14B, etch stop layer 44, dielectric layer 46, etch stop layer 48, and dielectric layer 50 are deposited. Next, openings 52A and 52B are formed, as shown in FIG. 14C. The formation of openings 52A and 52B may be performed through dry etching processes. A wet pre-cleaning process may then be performed, with the top surface of BARC 36 being exposed to the chemical used in the wet pre-cleaning process. BARC 36 protects the underlying metal pad 32 from the galvanic corrosion. Next, as shown in FIG. 14D, the exposed portion of BARC 36 is removed, for example, through sputtering in a process chamber, which is in the same environment as the chamber for depositing diffusion barrier 54. Diffusion barrier 54 is then deposited, for example, through PVD. The deposition may be performed in-situ with the sputtering of BARC 36, with no vacuum break between the sputtering of BARC 36 and the deposition of diffusion barrier 54. Metallic material 56 is then formed, for example, through plating, followed by a CMP process to form electrical connector 9. The resulting structure is shown in FIG. 14E.

The embodiments of the present disclosure have some advantageous features. By forming capping layers, which are either not etched-through for the formation of electrical connector, or etched-through through a sputtering process in-situ performed with the subsequently formed diffusion barrier, the adverse galvanic corrosion of metal pads is avoided.

In accordance with some embodiments of the present disclosure, a method comprises forming a conductive pad over an interconnect structure of a wafer; forming a capping layer over the conductive pad; forming a dielectric layer covering the capping layer; etching the dielectric layer to form an opening in the dielectric layer, wherein the capping layer is exposed to the opening; performing a wet-cleaning process on the wafer, wherein during the wet-cleaning process, a top surface of the capping layer is exposed to a chemical solution used for performing the wet-cleaning process; depositing a conductive diffusion barrier extending into the opening; and depositing a conductive material over the conductive diffusion barrier. In an embodiment, the method further comprises removing a portion of the capping layer through sputtering, with the opening further extending into the capping layer to reveal the conductive pad, wherein the sputtering the capping layer and the depositing the conductive diffusion barrier are in-situ performed in a same production tool (may be in different process chambers that are in a same vacuum environment). In an embodiment, the sputtering the capping layer and the depositing the conductive diffusion barrier are performed without vacuum break in between. In an embodiment, the forming the capping layer comprises depositing a dielectric material. In an embodiment, the forming the capping layer comprises depositing an additional conductive material. In an embodiment, the conductive diffusion barrier is deposited to have a bottom surface contacting the top surface of the capping layer. In an embodiment, the conductive diffusion barrier is deposited to penetrate through the capping layer. In an embodiment, the method further comprises forming an anti-reflective coating over the capping layer, wherein the dielectric layer is deposited over the anti-reflective coating, and wherein the conductive diffusion barrier penetrates through the anti-reflective coating. In an embodiment, the method further comprises forming an anti-reflective coating over the capping layer; and before the dielectric layer is deposited, removing the anti-reflective coating. In an embodiment, the method further comprises, before the dielectric layer is formed, depositing a sidewall capping layer extending on sidewalls of the conductive pad and the capping layer. In an embodiment, the depositing the sidewall capping layer comprises depositing a dielectric material. In an embodiment, the depositing the sidewall capping layer comprises depositing an additional conductive material. In an embodiment, the method further comprises, before the dielectric layer is formed, performing an oxidation process to oxidize sidewall surface portions of the conductive pad, with a metal oxide being formed on sidewalls of the conductive pad.

In accordance with some embodiments of the present disclosure, a structure comprises a conductive pad; a capping layer over and contacting the conductive pad; a dielectric layer extending on a first top surface and sidewalls of the conductive pad and the capping layer; and a conductive via extending into the dielectric layer, wherein the via overlaps a portion of the conductive pad, and the via is signally coupled to the conductive pad. In an embodiment, the capping layer comprises a dielectric material. In an embodiment, the capping layer comprises a conductive layer. In an embodiment, the conductive via has a bottom surface contacting a second top surface of the capping layer to form an interface. In an embodiment, the conductive via extends into the capping layer to contact the first top surface of the conductive pad.

In accordance with some embodiments of the present disclosure, a structure comprises a semiconductor substrate; an interconnect structure over the semiconductor substrate; a diffusion barrier over the interconnect structure; a metal pad over the diffusion barrier; a capping layer over and contacting the metal pad; a first dielectric layer over and contacting the capping layer, wherein edges of the diffusion barrier, the metal pad, the capping layer, and the first dielectric layer are substantially vertically aligned; a second dielectric layer extending on a first top surface and sidewalls of the diffusion barrier, the metal pad, the capping layer, and the first dielectric layer; and a conductive via extending into the second dielectric layer and the first dielectric layer to contact the capping layer. In an embodiment, the conductive via contacts a second top surface of the capping layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a conductive pad over an interconnect structure of a wafer;
forming a capping layer over the conductive pad;
forming an anti-reflective coating over the capping layer;
depositing a dielectric layer over the anti-reflective coating;
etching the dielectric layer to form an opening in the dielectric layer, wherein the capping layer is exposed to the opening;
performing a wet-cleaning process on the wafer, wherein during the wet-cleaning process, a top surface of the capping layer is exposed to a chemical solution used for performing the wet-cleaning process;
depositing a conductive diffusion barrier extending into the opening and penetrating through the anti-reflective coating; and
depositing a conductive material over the conductive diffusion barrier.

2. The method of claim 1 further comprising removing a portion of the capping layer through sputtering, with the opening further extending into the capping layer to reveal the conductive pad, wherein the sputtering the capping layer and the depositing the conductive diffusion barrier are in-situ performed in a same process vacuum environment.

3. The method of claim 2, wherein the sputtering the capping layer and the depositing the conductive diffusion barrier are performed without vacuum break in between.

4. The method of claim 1, wherein the forming the capping layer comprises depositing a dielectric material.

5. The method of claim 1, wherein the forming the capping layer comprises depositing an additional conductive material.

6. The method of claim 1, wherein the conductive diffusion barrier is deposited to have a bottom surface contacting the top surface of the capping layer.

7. The method of claim 1, wherein the conductive diffusion barrier is deposited to penetrate through the capping layer.

8. The method of claim 1 further comprising, before the dielectric layer is formed, depositing a sidewall capping layer extending on sidewalls of the conductive pad and the capping layer.

9. The method of claim 8, wherein the depositing the sidewall capping layer comprises depositing a dielectric material.

10. The method of claim 8, wherein the depositing the sidewall capping layer comprises depositing an additional conductive material.

11. The method of claim 1 further comprising, before the dielectric layer is formed, performing an oxidation process to oxidize sidewall surface portions of the conductive pad, with a metal oxide being formed on sidewalls of the conductive pad.

12. A method comprising:
depositing a plurality of layers;
patterning the plurality of layers to form a conductive pad and a capping layer over and contacting the conductive pad;
forming a dielectric layer, wherein the dielectric layer comprises a top portion over the capping layer, and a sidewall portion on sidewalls of the conductive pad and the capping layer;
etching the dielectric layer to form an opening in the dielectric layer, wherein the capping layer is exposed to the opening;
sputtering the capping layer to remove a portion of the capping layer, wherein the sputtering is stopped before the conductive pad is exposed; and
forming a conductive via extending into the dielectric layer, wherein the conductive via overlaps a portion of the conductive pad, and the conductive via is signally coupled to the conductive pad, wherein the forming the conductive via comprises:
depositing a diffusion barrier layer extending into the opening to contact the capping layer, wherein the sputtering the capping layer and the depositing the diffusion barrier layer are in-situ performed in a same vacuum environment.

13. The method of claim 12, wherein the capping layer comprises a dielectric material.

14. The method of claim 12, wherein the capping layer comprises a conductive layer.

15. The method of claim 12, wherein the forming the conductive via comprises:
sputtering the capping layer to remove a portion of the capping layer, until the conductive pad is exposed, wherein the sputtering the capping layer and the depositing the diffusion barrier layer are in-situ performed in a same vacuum environment.

16. A method comprising:
forming an interconnect structure over a semiconductor substrate;
forming a diffusion barrier over the interconnect structure;
forming a metal pad over the diffusion barrier;
forming a capping layer over and contacting the metal pad;
forming a first dielectric layer over and contacting the capping layer, wherein edges of the diffusion barrier, the metal pad, the capping layer, and the first dielectric layer are substantially vertically aligned;
forming a second dielectric layer extending on a first top surface and sidewalls of the diffusion barrier, the metal pad, the capping layer, and the first dielectric layer, wherein the second dielectric layer comprises a first portion higher than the first top surface of the diffusion barrier, and a second portion lower than the first top surface of the diffusion barrier; and
forming a conductive via extending into the second dielectric layer and the first dielectric layer to contact the capping layer.

17. The method of claim 16 further comprising:
forming a bottom anti-reflective coating and a patterned photoresist, wherein the capping layer, the metal pad, and the diffusion barrier are formed through patterning processes, with the patterned photoresist being used as an etching mask in the patterning processes, and wherein the bottom anti-reflective coating is used for reducing reflection in the patterning processes; and
removing the patterned photoresist, wherein the bottom anti-reflective coating is left unremoved as being the first dielectric layer.

18. The method of claim 12, wherein sputtering the capping layer is performed using an inert gas.

19. The method of claim 16, wherein the forming the capping layer comprises depositing a dielectric material.

* * * * *